US011398575B2

(12) United States Patent
Youtsey et al.

(10) Patent No.: US 11,398,575 B2
(45) Date of Patent: Jul. 26, 2022

(54) BACK-CONTACT THIN FILM SEMICONDUCTOR DEVICE STRUCTURES AND METHODS FOR THEIR PRODUCTION

(71) Applicant: MICROLINK DEVICES, INC., Niles, IL (US)

(72) Inventors: Christopher Youtsey, Libertyville, IL (US); Rekha Reddy, Chicago, IL (US); Christopher Stender, Glenview, IL (US)

(73) Assignee: MICROLINK DEVICES, INC., Niles, IL (US)

( * ) Notice: Subject to any disclaimer, the term of this patent is extended or adjusted under 35 U.S.C. 154(b) by 52 days.

(21) Appl. No.: 15/947,683

(22) Filed: Apr. 6, 2018

(65) Prior Publication Data

US 2018/0294372 A1 Oct. 11, 2018

Related U.S. Application Data

(60) Provisional application No. 62/483,190, filed on Apr. 7, 2017.

(51) Int. Cl.
*H01L 31/0463* (2014.01)
*H01L 31/048* (2014.01)
(Continued)

(52) U.S. Cl.
CPC .. *H01L 31/0463* (2014.12); *H01L 31/022441* (2013.01); *H01L 31/0392* (2013.01);
(Continued)

(58) Field of Classification Search
CPC ......... H01L 31/0463; H01L 31/022441; H01L 31/1892; H01L 31/0392; H01L 31/0516; H01L 31/048; H01L 21/02063; H01L 21/486; H01L 21/76829; H01L 21/76831; H01L 21/76877; H01L 21/76879; H01L 21/76897; H01L 23/481; H01L 23/5226;
(Continued)

(56) References Cited

U.S. PATENT DOCUMENTS 6,011,215 A 1/2000 Glatfelter et al.
6,103,970 A * 8/2000 Kilmer ............... H01L 31/1852
136/252

(Continued)

FOREIGN PATENT DOCUMENTS

JP 04223378 A * 8/1992
KR 10-2010-0004540 A 1/2010

OTHER PUBLICATIONS

Cousins et al., Generation 3: Improved Performance at Lower Cost. 35th IEEE Photovoltaic Specialists Conference. 4 pages, Jun. 20-25, 2010.

(Continued)

*Primary Examiner* — Michael Y Sun
(74) *Attorney, Agent, or Firm* — McCarter & English, LLP

(57) ABSTRACT

Systems and methods taught herein provide thin film semiconductor devices such as thin film photovoltaic devices having via holes that enable electrical connection with a bottom surface of a topside contact of the thin film semiconductor device via the back side of the device (e.g., during mounting of the device). In some embodiments, the via holes are electrically insulated.

15 Claims, 16 Drawing Sheets

(51) Int. Cl.

| | | |
|---|---|---|
| *H01L 31/05* | (2014.01) | |
| *H01L 31/18* | (2006.01) | |
| *H01L 31/0224* | (2006.01) | |
| *H01L 31/0392* | (2006.01) | |
| *H01L 21/768* | (2006.01) | |
| *H01L 21/48* | (2006.01) | |
| *H01L 23/522* | (2006.01) | |
| *H01L 23/48* | (2006.01) | |
| *H01L 21/02* | (2006.01) | |

(52) U.S. Cl.
CPC ........ *H01L 31/048* (2013.01); *H01L 31/0516* (2013.01); *H01L 31/1892* (2013.01); *H01L 21/02063* (2013.01); *H01L 21/486* (2013.01); *H01L 21/76829* (2013.01); *H01L 21/76831* (2013.01); *H01L 21/76877* (2013.01); *H01L 21/76879* (2013.01); *H01L 21/76897* (2013.01); *H01L 23/481* (2013.01); *H01L 23/5226* (2013.01); *H01L 2224/05009* (2013.01); *H01L 2224/05087* (2013.01); *H01L 2225/06541* (2013.01); *Y02E 10/50* (2013.01)

(58) Field of Classification Search
CPC . H01L 2224/05009; H01L 2224/05087; H01L 2225/06541; Y02E 10/50
See application file for complete search history.

(56) References Cited

U.S. PATENT DOCUMENTS

| | | | | |
|---|---|---|---|---|
| 2004/0206389 | A1* | 10/2004 | Takamoto | H01L 31/03046 136/255 |
| 2008/0308148 | A1* | 12/2008 | Leidholm | H01L 31/0465 136/256 |
| 2009/0038678 | A1* | 2/2009 | Pan | H01L 31/06875 136/255 |
| 2010/0012171 | A1* | 1/2010 | Ammar | H01L 31/052 136/246 |
| 2010/0126573 | A1* | 5/2010 | Youtsey | H01L 31/0687 136/255 |
| 2012/0211068 | A1* | 8/2012 | Cornfeld | H01L 31/06875 136/255 |
| 2012/0298192 | A1 | 11/2012 | Zhang et al. | |
| 2013/0025659 | A1* | 1/2013 | Bedell | H01L 31/0687 136/255 |
| 2014/0076388 | A1* | 3/2014 | King | H01L 31/0725 136/255 |
| 2014/0196779 | A1* | 7/2014 | Fidaner | H01L 31/022441 136/255 |
| 2015/0068580 | A1 | 3/2015 | Probst | |
| 2018/0097128 | A1* | 4/2018 | Koike | H01L 31/022425 |

OTHER PUBLICATIONS

Lammert et al., The Interdigitated Back Contact Solar Cell: A Silicon Solar Cell for Use in Concentrated Sunlight. IEEE Transactions on Electron Devices. Apr. 1977;ED-24;337-342.

Lillington, Development of Advanced Silicon Solar Cells for Space Station Freedom. NASA Contractor Report 189215. Spectrolab, Inc. 110 pages, Aug. 9, 1990.

Oliva et al., GaInP/AlGaAs metal-wrap-through tandem concentrator solar cells. Progress in Photovoltaics: Research and Applications. Oct. 12, 2016;25:477-483.

Salvetat et al., III-V Multi-Junction Solar Cell Using Metal Wrap Through Contacts. 12th International Conference on Concentrator Photovoltaic Systems (CPV-12), pp. 060004-1-060004-5, Sep. 1, 2016.

Scheiman et al., High Efficiency Flexible Triple Junction Solar Panels. IEEE 40th Photovoltaic Specialist Conference. pp. 1376-1380, Jun. 8-13, 2014.

Smith et al., Generation III High Efficiency Lower Cost Technology: Transition to full scale Manufacturing. 38th IEEE Photovoltaic Specialists Conference. 4 pages, Jun. 3-8, 2012.

Stender et al., Flexible and Lightweight Epitaxial Lift-Off GaAs Multi-Junction Solar Cells for Portable Power and UAV Applications. IEEE 42nd Photovoltaic Specialist Conference. 4 pages, Jun. 14-19, 2015.

Van Kerschaver et al., Back-contact Solar Cells: A Review. Progress in Photovoltaics: Research and Applications. Jan. 2006;14(1):107-123.

Zhao et al., Inductively coupled plasma etching of through-cell vias in III-V multijunction solar cells using SiCl4/Ar. J Vac Sci Technol B. Nov./Dec. 2013;31(6):06FF05-1-06FF05-5.

International Search Report and Written Opinion for Application No. PCT/US2018/026599, dated Jun. 14, 2018. 14 pages.

* cited by examiner

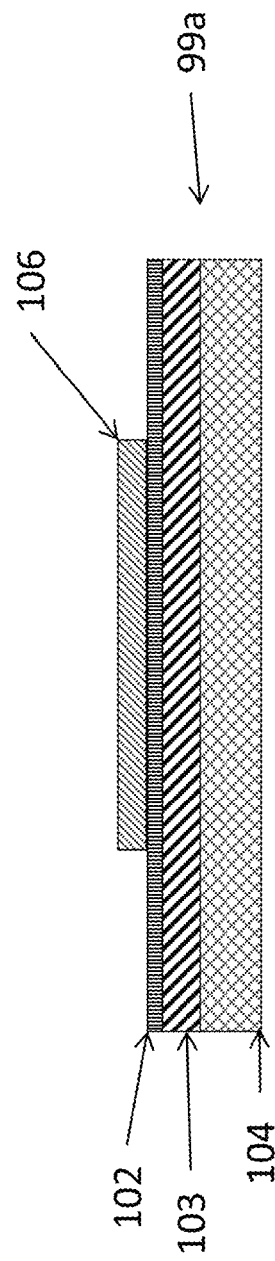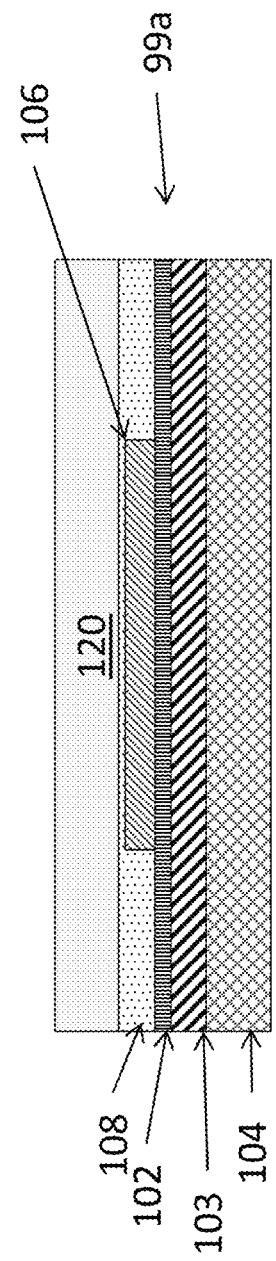
FIG. 3A
FIG. 3B

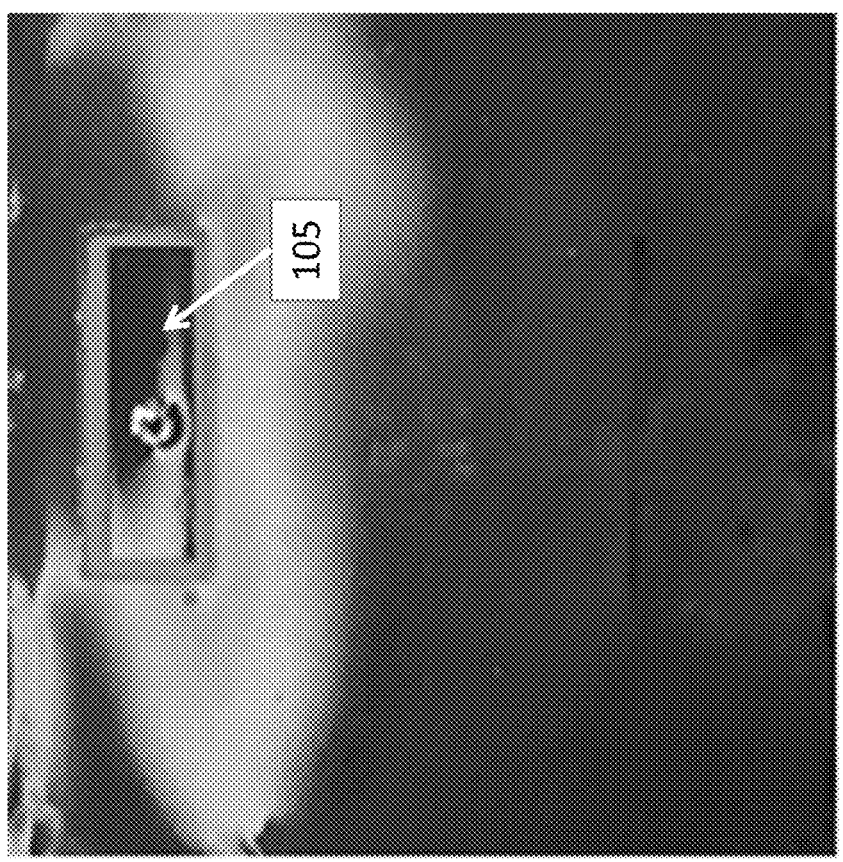
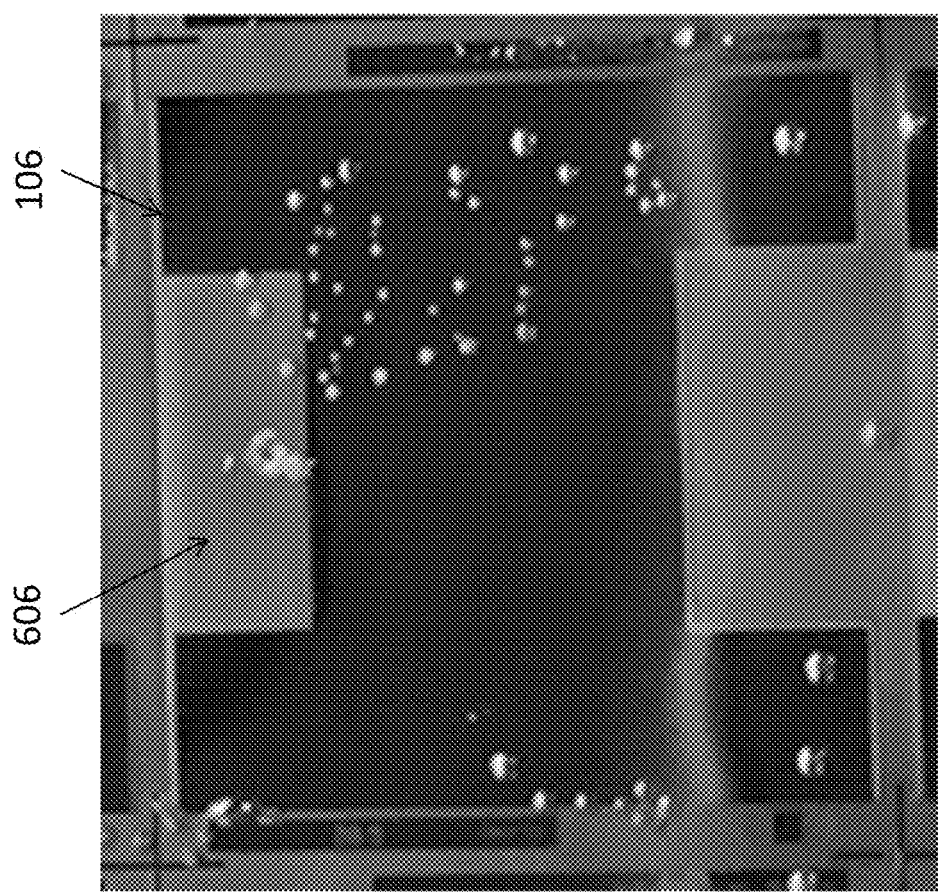
FIG. 5B
FIG. 5A

BACK-CONTACT THIN FILM SEMICONDUCTOR DEVICE STRUCTURES AND METHODS FOR THEIR PRODUCTION

RELATED APPLICATION

The present application claims benefit of and priority to U.S. Provisional Patent Application No. 62/483,190, filed Apr. 7, 2017, the entire content of which is hereby incorporated by reference.

GOVERNMENT SUPPORT

This invention was made with government support from the National Aeronautics and Space Administration (NASA) under Contract No. NNX16CC16C. The government has certain rights in this invention.

BACKGROUND

Vertical semiconductor device structures often have contacts on the topside and backside of the structure. It is desirable to position all of the electrical connections for the structure on the backside for ease of mounting.

SUMMARY

Some systems and methods taught herein provide thin film semiconductor devices having electrically via holes that enable electrical connection with a bottom surface of the topside contact of the semiconductor device via the back side of the device (e.g., during mounting of the device). In some embodiments, the via holes are electrically insulated. Advantageously, the thin film semiconductor devices are not fabricated using a wrap-through approach and associated complex process steps. The approach described herein, termed "through-epi via" (TEV), includes a simplified fabrication process with lower process complexity than some previous methods. In addition, methods described herein enable application of a transparent support to the thin film semiconductor devices at the wafer level, which in some embodiments, can greatly reduce the expense of adding the transparent support to semiconductor devices at the individual cell level.

A thin film semiconductor photovoltaic device is described herein in accordance with some embodiments. The thin film semiconductor photovoltaic device includes a semiconductor region having an emitter region and a base region, a topside contact disposed on a top illuminated surface of the semiconductor region, and a bottom backside contact disposed on a portion of a bottom surface of the semiconductor region facing away from the top illuminated surface of the semiconductor region. The thin film semiconductor photovoltaic device also includes a via hole extending through the bottom backside contact and the semiconductor region allowing access to a bottom surface of the topside contact from a backside portion of the thin film semiconductor photovoltaic device, the via hole having an open end and a closed end with a portion of the bottom surface of the topside contact forming at least a portion of the closed end. In some embodiments, the semiconductor region includes a plurality of semiconductor layers forming one or more junctions.

A method for fabricating a thin film semiconductor photovoltaic device is described herein in accordance with some embodiments. The method includes providing a thin film structure including a semiconductor region having an emitter region and a base region, a topside contact disposed on a top surface of the semiconductor region, and a bottom backside contact disposed on a bottom backside surface of the semiconductor region facing away from the top surface, the structure free of a substrate on which the semiconductor layers were formed. The method also includes forming a via hole extending through the bottom backside contact and through the semiconductor region, the via hole having an open end and a closed end and exposing a portion of a bottom surface of the topside contact through the open end, the exposed portion of the topside contact forming at least a portion of the closed end of the via hole.

A thin film semiconductor device is described herein. The thin film semiconductor device includes a semiconductor region comprising one or more semiconductor layers. The one or more semiconductor layers form at least one junction. The thin film semiconductor device includes a topside contact disposed on a top surface of the semiconductor region and a bottom backside contact disposed on a portion of a bottom surface of the semiconductor region facing away from the top surface of the semiconductor region. The thin film semiconductor device includes a via hole extending through the bottom backside contact and the semiconductor region allowing access to a bottom surface of the topside contact from a backside portion of the thin film semiconductor device. The via hole has an open end and a closed end, and a portion of the bottom surface of the topside contact forms at least a portion of the closed end.

A method for fabricating a thin film semiconductor device is provided. The method includes providing a structure including a semiconductor region comprising one or more semiconductor layers, a topside contact disposed on a top surface of the semiconductor region, and a bottom backside contact disposed on a bottom backside surface of the semiconductor region facing away from the top surface. The provided structure is free of a substrate on which the semiconductor layers were formed. The method also includes forming a via hole extending through the bottom backside contact and through the semiconductor region. The via hole has an open end and a closed end and exposes a portion of the topside contact through the open end. The exposed portion of the topside contact forms at least a portion of the closed end of the via hole.

In some embodiments of methods described herein, the method also includes attaching a transparent support to the thin film structure over the topside contact prior to forming the via hole. The method can also include insulating, at least, side surfaces of the via hole to form an insulated sidewall while leaving a portion of the topside contact exposed through the open portion of the via hole. In some embodiments, wherein the step of forming the via hole includes removing a portion of the backside contact and a portion of the semiconductor region thereby exposing the portion of the bottom surface of the topside contact. In some embodiments, removing the portion of the backside contact includes at least one of wet etching, dry etching, or laser ablating the backside contact. In some embodiments, removing the portion of the semiconductor region up to the topside contact includes at least one of wet etching, dry etching, or laser ablating the semiconductor region. In some embodiments, removing the portion of the backside contact results in a hole having a first diameter, length, or width through the backside contact, and removing the portion of the semiconductor region up to the bottom surface of the topside contact results in a hole through the semiconductor region having a second diameter, length, or width smaller than the first diameter, length, or width.

In some embodiments of the methods described herein, providing the thin film structure including the semiconductor region, the topside contact disposed on the top surface of the semiconductor region, and the bottom backside contact disposed on the bottom backside surface of the semiconductor region facing away from the top surface includes: providing a substrate; forming a sacrificial layer on the substrate; forming the semiconductor region over the sacrificial layer; forming the bottom backside contact over the semiconductor region; removing the sacrificial layer to separate the semiconductor region and the bottom backside contact from the substrate; and forming the topside contact over the semiconductor region. In some embodiments, removing the sacrificial layer to separate the semiconductor region and the bottom backside contact from the substrate comprises selectively etching the sacrificial layer.

In some embodiments of the methods described herein, forming the topside contact layer over the semiconductor region includes forming a metal grid connected to one or more metal via connection areas. In some embodiments, at least one of the metal via connection areas of the topside contact is disposed in a central region of the thin film semiconductor device away from an edge of the thin film semiconductor device.

In some embodiments of the methods described herein, the method also includes forming one or more additional via holes extending through the bottom backside contact and through the semiconductor region, each of the additional via holes having an open end and closed end and exposing a portion of the bottom surface of the topside contact through the open end where the exposed portion of the topside contact forms at least a portion of the closed end of the respective via hole. The method can also include for each via hole, insulating, at least, side surfaces of the via hole to form an insulated sidewall in the via hole while leaving a portion of the topside contact exposed through the open portion of the respective via hole.

In any of the embodiments described herein, the device can include a transparent support. The transparent support can include at least one of a glass or polymer. In any of the embodiments described herein, the device can include an electrically insulating layer covering, at least, the side surfaces of the bottom backside contact and the semiconductor region in the via hole forming a sidewall surface. The electrically insulating layer can include a solder mask material. The solder mask material can include a polymer, an epoxy, an acrylic, or an oxide. The electrically insulating layer can be configured to draw in a liquid solder material such that the liquid solder material makes electrical contact with the topside contact. The electrically insulating layer can be configured to prevent the drawn in liquid solder material from directly contacting the bottom backside contact and the semiconductor region. The electrically insulating layer can have a first width at the via hole as measured between the sidewall surface and a side surface of the bottom backside contact and has a second width at the via hole as measured between the sidewall surface and a side surface of the semiconductor region. The second width can be smaller than the first width. The electrically insulating layer can have a first outer diameter, length, or width at the via hole as measured at the interface between the electrically insulating layer and the side surface of the bottom backside contact and a second outer diameter, length, or width at the via hole as measured at the interface of the electrically insulating layer and the side surface of the semiconductor region. The first outer diameter, length, or width can be larger than the second outer diameter, length, or width.

In any embodiment described herein, the topside contact can include a metal grid connected to one or more metal via connection areas. At least one of the metal via connection areas of the topside contact can be disposed in a central region of the semiconductor device away from an edge of the semiconductor device. In any embodiment described herein, the via hole can be formed by at least one of wet etching, dry etching, or laser ablation. In any embodiment described herein, the via hole can have a first diameter, length, or width through the bottom backside contact and the via hole has a second diameter, length or width at the semiconductor region smaller than the first diameter, length, or width. The difference between the first diameter, length, or width of the via hole and the second diameter, length, or width of the via hole can result in the semiconductor region having a ledge.

In any embodiment described herein, an aspect ratio of the depth of the via hole to a diameter, a length or a width of the via hole can be in a range from 1:1 to 1:70. The aspect ratio can be in a range from 1:10 to 1:50. In any embodiment described herein, a total thickness of the semiconductor region, the topside contact, and the bottom backside contact can be in a range from 5 microns to 100 microns. The total thickness of the semiconductor region, the topside contact, and the bottom backside contact can be in a range from 20 microns to 50 microns. The total thickness of the semiconductor region, the topside contact, and the bottom backside contact can be in a range from 30 microns to 40 microns. In any embodiment described herein, the one or more semiconductor layers can comprise a base region and an emitter region. At least one of the one or more semiconductor layers can comprise at least one of GaAs, GaInAs, GaInAsP, InGaAlP, InGaP, InAlP, AlGaAs, AlGaAsP, InAlGaAs, InP, GaN, AlGaN, InGaN, InAlGaN, AlN, Ge, or GaAsP In any embodiment described herein, the semiconductor region can include multiple vertically-stacked junctions. In any embodiment described herein, the thin film semiconductor device can include one or more additional via holes extending through the bottom backside contact and the semiconductor region allowing access to the bottom surface of the topside contact from a backside portion of the thin film semiconductor device, each of the additional via holes having an open end and a closed end with a portion of the topside contact forming at least a portion of each closed end. For each via hole, an electrically insulating layer covering side surfaces of the bottom backside contact and the semiconductor region in the via hole can form a sidewall surface of the respective via hole.

In any embodiment described herein, the topside contact can form the entire closed end of the via hole. In any embodiment described herein, the semiconductor device can be a photovoltaic semiconductor device that generates an electric current when the top surface of the semiconductor region is illuminated. The thin film semiconductor device can be a thin film solar cell device. The thin film semiconductor device can be a photodiode device. The thin film semiconductor device can be a diode device. The thin film semiconductor device can be a Schottky diode.

In any embodiment described herein, the top surface of the semiconductor region at a first area can correspond to a top surface of a first semiconductor layer in the one or more semiconductor layers and the topside contact can be a first topside contact. The semiconductor device can include a second topside contact disposed on a top surface of a second semiconductor layer in the one or more semiconductor layers at a second area laterally offset from the first area, wherein the top surface of the semiconductor region at the second area is a top surface of the second semiconductor layer and a second via hole at the second area extending through the bottom backside contact and a portion of the semiconductor region allowing access to a bottom surface of the second topside contact from a backside portion of the thin film semiconductor device, the second via hole having an open end and a closed end with a portion of the second topside contact forming at least a portion of the closed end. In some embodiments, the device includes a transistor.

In any embodiment described herein, the one or more semiconductor layers can be one or more epitaxial semiconductor layers.

A solar power system is described herein. The solar power system includes a first photovoltaic device in accordance with any embodiments described herein and second thin film semiconductor device in accordance with any device embodiments described herein. The solar power system also includes a circuit board including electrical conductors to interconnect the topside contacts of each thin film semiconductor device and the bottom backside contacts of each thin film semiconductor device. In some embodiments, the circuit board is flexible. In some embodiments, the solar power system includes a bypass diode. In some embodiments, the system is a concentrated photovoltaic (CPV) solar system and at least the first photovoltaic device is configured to handle high current densities associated with CPV systems.

BRIEF DESCRIPTION OF THE DRAWINGS

The skilled artisan will understand that the drawings are primarily for illustrative purposes and are not intended to limit the scope of the subject matter described herein. The drawings are not necessarily to scale; in some instances, various aspects of the subject matter disclosed herein may be shown exaggerated or enlarged in the drawings to facilitate an understanding of different features. In the drawings, like reference characters generally refer to like features (e.g., functionally similar or structurally similar elements).

The foregoing and other features and advantages provided by the present disclosure will be more fully understood from the following description of exemplary embodiments when read together with the accompanying drawings, in which:

FIG. 3A illustrates a starting structure for producing a thin film semiconductor device in accordance with some embodiments of the present disclosure.

FIG. 3B illustrates the structure of FIG. 3A after a step in the process of producing a thin film semiconductor device in accordance with some embodiments of the present disclosure.

FIG. 5A illustrates a top view of an exemplary semiconductor device produced in accordance with some embodiments;

FIG. 5B illustrates a bottom view of the semiconductor device of FIG. 5A;

DETAILED DESCRIPTION

Figure 1:
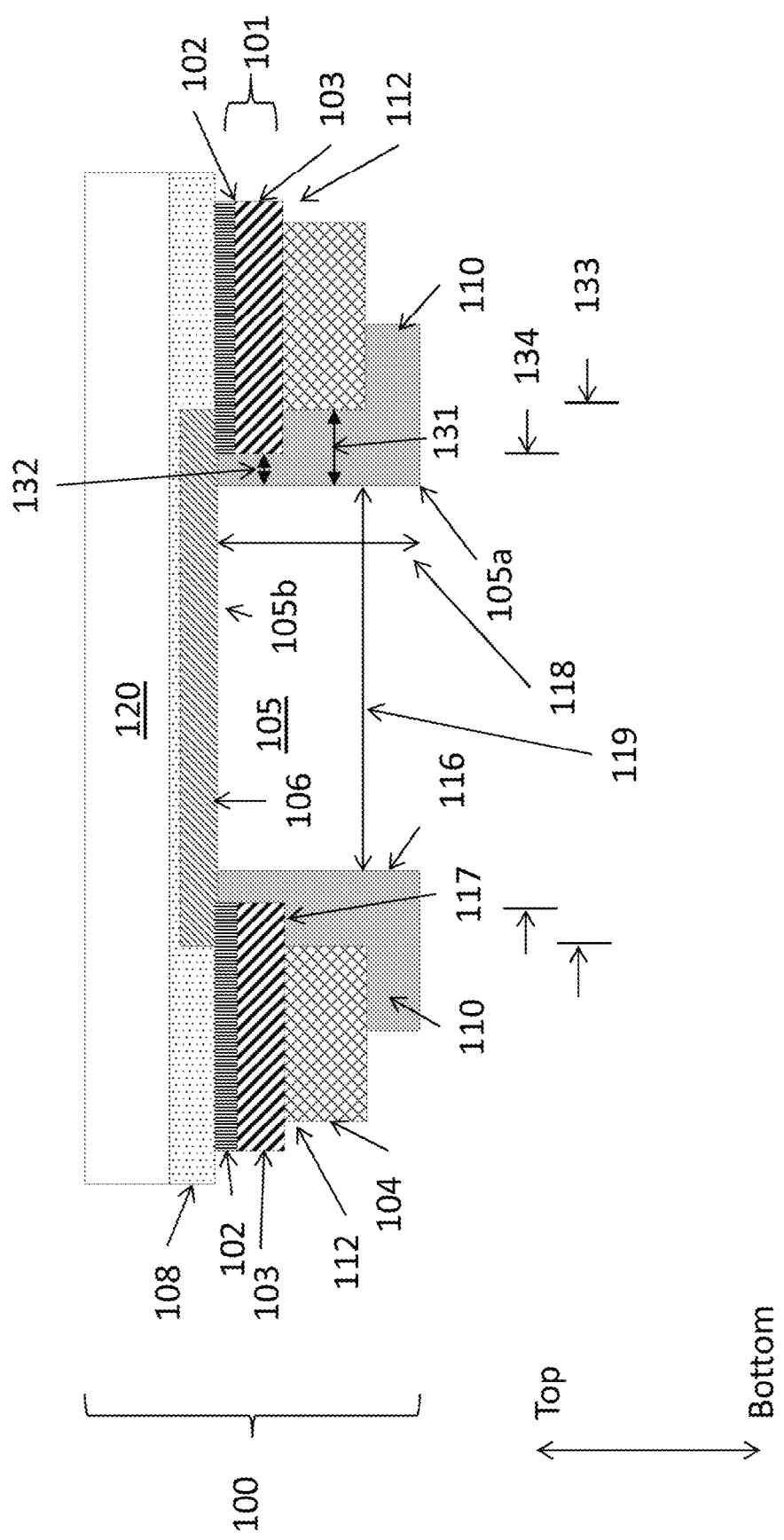
FIG. 1 schematically illustrates a side cross-sectional view of a thin film semiconductor device in accordance with some embodiments of the present disclosure.

Systems and methods taught herein provide thin film semiconductor devices having via holes that enable electrical connection with the bottom surface of the topside contact of the semiconductor device from the back-side of the semiconductor device (e.g., during mounting of the semiconductor device) through the via hole. In some embodiments, sidewalls of the via holes are electrically insulated. Advantageously, the thin film semiconductor devices are not fabricated using a wrap-through approach and associated complex process steps. The approach described herein, termed "through-epi via" (TEV), includes a simplified fabrication process with lower process complexity than previous methods. In addition, methods described herein enable application of a transparent support to the thin film semiconductor device structures at the wafer level thereby greatly reducing the expense of adding the transparent support to semiconductor device structures at the individual cell level or at the individual device level.

In conventional semiconductor devices using wrap-through approaches to connect with a front side contact, the process of creating the metallization or emitter wrap-through to a front side contact can create shorts or shunts in the cell. For example, the insulating dielectric that is placed into the wrap-through channel before the conductor or emitter is placed often has pinholes that allow for shorting between the conductor and other layers in the semiconductor device. In part, these challenges arise because of the increased process complexity to produce wrap-through contacts. In part, the complexity arises from the challenge in forming high-aspect ratio holes through the entire thickness of the semiconductor device structure, and in carrying out fabrication processes such as lithography and metallization within high-aspect ratio holes. The TEV process described herein is more reliable than conventional wrap-through approaches and, thus, results in a higher yield at the end of the process. In addition, processes described herein can use the same number of lithographic mask levels as the standard production process for top-contact semiconductor devices in some embodiments. This reduced complexity increases yield and reduces error in the resulting structures and devices.

As used herein, the term junction refers to an interface between two layers of dissimilar materials, where one or of both of the layers is a semiconductor material. For example, the materials may be differentiated by composition (e.g., GaAs, InGaP, etc.) or by doping (p or n). The term junction includes both a semiconductor-semiconductor junction and a metal-semiconductor junction.

As used herein, "semiconductor region" refers to one or more layers of the device between the topside contact and the bottom backside contact. In some embodiments, the semiconductor region has an emitter region and a base region. In some embodiments, the semiconductor region includes one or more semiconductor layers that form at least one junction. In some embodiments, the semiconductor region includes one or more semiconductor layers that form a junction with another semiconductor layer in the semiconductor region (e.g., a semiconductor-semiconductor junction). In some embodiments, a junction is formed between a semiconductor layer in the semiconductor region and a metal contact (e.g., the topside contact or the bottom backside contact) forming a metal-semiconductor junction. In some embodiments, the semiconductor region includes one or more semiconductor layers that form multiple junctions. In some embodiments, one or more of the semiconductor layers in the semiconductor region has an associated band gap energy. In some embodiments, the semiconductor region includes additional semiconductor layers that do not form any of the one or more junctions. In some embodiments, the semiconductor region can include layers other than semiconductor layers such as dielectric layers.

As used herein, the term "active layer" refers to a semiconductor material layer of a semiconductor device structure differentiated from neighboring layers by doping (e.g., p or n) or composition (e.g., GaAs, InGaP, etc.) and that has an associated band gap energy.

Systems and methods described herein provide a thin-film semiconductor device including a semiconductor region comprising one or more semiconductor layers disposed between a topside contact and a bottom backside contact. The thin-film semiconductor device does not include the substrate upon which the layers were formed in exemplary embodiments. The thin-film semiconductor device includes a via hole that extends through the bottom backside contact and the semiconductor region to allow access to a bottom surface of the topside contact from a backside portion of the thin film semiconductor device.

In some exemplary embodiments, thin film semiconductor devices of the present disclosure are or include solar cells. In other embodiments, the thin film semiconductor devices of the present disclosure are or include optoelectronic devices such as light emitting diodes, photodiodes, laser diodes, or photodetectors or electronic devices such as diodes or transistors. In embodiments where the thin film semiconductor device is or includes a solar cell, the solar cell can include a vertical diode structure that has electrical contacts connected to each of an emitter and a base of the diode. For a solar cell, the electrical contact on the topside is usually referred to as a grid contact and comprises an array of metal conductors (e.g., grid lines) designed to form an ohmic contact to a semiconductor top surface to collect photo-generated electrical carriers. The width and spacing of the grid lines are optimized to transmit as much light as possible to the semiconductor surface (i.e., minimizing "shadow" losses) while also minimizing electrical resistance losses in the grid contact. Gains of as much as 5% relative improvement can be realized by reducing topside grid and bond-pad shadowing as well as reducing series resistance losses by employing backside contacts. The gains can be even greater in applications with very high current density such as high concentration photovoltaic systems. The electrical contact on the backside forms an ohmic contact to a semiconductor bottom surface and collects photogenerated carriers. In some semiconductor devices, the bottom backside contact covers the entire backside of the solar cell. An array of solar cell devices can be formed by making series, parallel, or both types of electrical connections among a plurality of individual solar cell devices.

There are several advantages to positioning contact pads for both the emitter and the base on the backside of a vertical semiconductor device structure such as a solar cell. In some instances, efficiency can be improved by reducing shadow and resistive losses related to the topside grid metallization because backside contact designs allow the topside grid metal contact area to be reduced or eliminated. Another advantage is simplified panel assembly as all interconnections between solar cells can be performed on the backplane connected to the backside of the solar cell semiconductor devices. For example, the ability to form all electrical contacts on the backside of the solar cell device opens up new and inexpensive approaches for cell laydown and panel assembly compared to the labor-intensive ribbon welding of cells used in manufacturing of arrays currently. This also enables cells to be spaced more compactly in the arrays, improving panel-level efficiency.

Figure 15A:
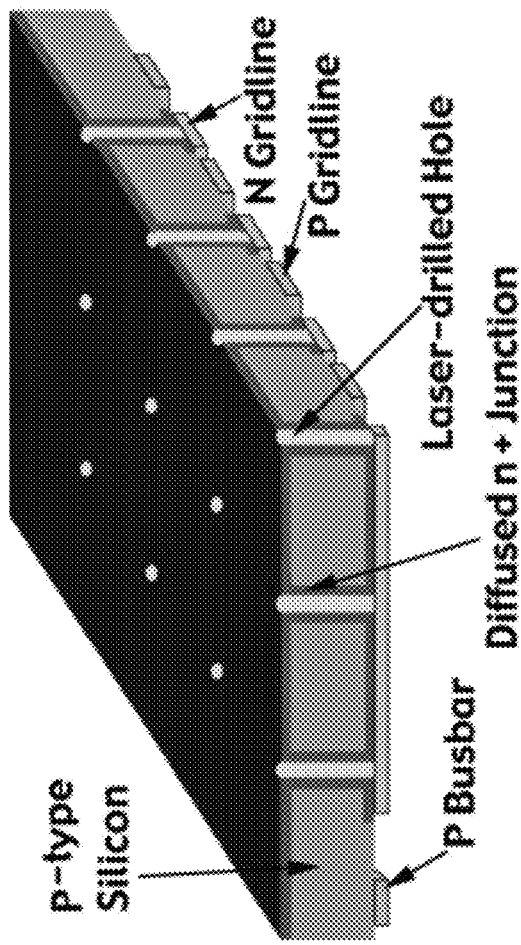
FIG. 15A illustrates a prior art device produced according to an emitter wrap-through methodology.
Figure 15B:
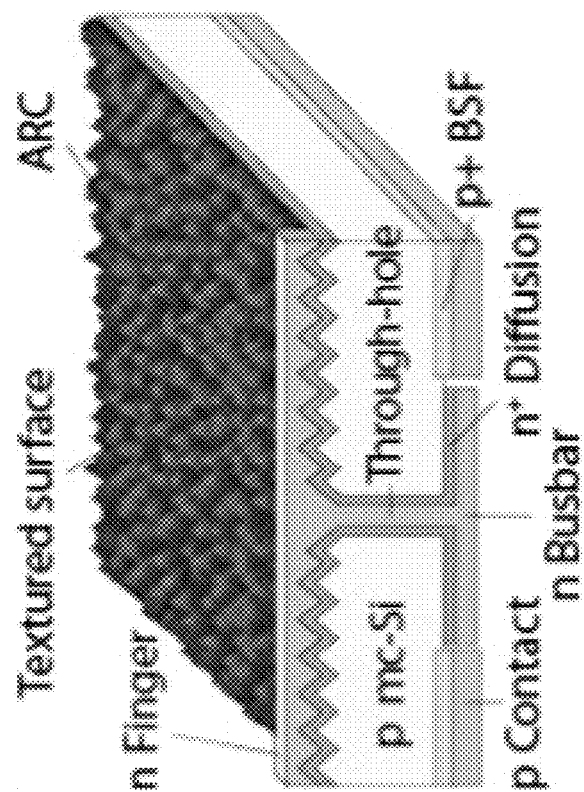
FIG. 15B illustrates a prior art device produced according to a metal wrap-through methodology.

In many configurations, the emitter is on the top surface of the solar cell. Thus, the backside contact pads for the emitter must be electrically connected with the topside electrical contact (e.g., the grid contact). In conventional designs, fabrication approaches to locate an emitter contact pad on the backside of the solar cell relied on "wrap-through" schemes to conduct current from the topside emitter to the backside contact pad. Most commonly used are metallization wrap-through (MWT) or emitter wrap-through (EWT) designs. An example of an EWT design is shown in FIG. 15A while an example of a MWT design is shown in FIG. 15B. A third approach is a back-junction (BJ) design, in which the emitter is not located on the front surface but in a localized region on the backside of the wafer that can be contacted directly.

The highest efficiency solar cells currently in production are multi-junction designs using three junctions on germanium substrates or inverted metamorphic multi-junction (IMM) layer structures with three or more junctions. IMM solar cells are described as inverted because they are grown upside down with the top of the solar cell facing the substrate being grown first and the bottom of the solar cell being grown over the top, then after separation of the solar cell from the substrate, the solar cell is flipped or inverted. Metamorphic solar cells refer to solar cells in which one or more of the layers are not lattice matched to a substrate on which the layers of the solar cell were grown.

One important challenge to applying EWT or MWT techniques to high-efficiency solar cells such as IMM is the process complexity of wrap through techniques for solar cells. The EWT process first requires the etching or ablation of a via hole through the substrate and semiconductor layer structure. An insulating dielectric must be applied to the sidewalls of the via hole, and an opening formed in the dielectric layer at the bottom of the via. Finally, a conformal metallization is applied inside the via to contact the topside grid metallization and carry current to the backside emitter contact. These additional process steps increase cost and can lower processing yield. For example, an emitter wrap-through process flow can require twice the number of photolithographic patterning steps as a conventional solar cell with topside contacts.

The use of through-epi via holes in accordance with this disclosure improves yield and reduces process complexity while still enjoying the numerous advantages of connecting to the topside contact through the backside of the semiconductor device structure such as reduced shadowing, increased ease of assembly, and easy incorporation of bypass diodes.

FIG. 1 illustrates a thin film semiconductor device 100 according to some embodiments of the present application. The thin film semiconductor device 100 includes a semiconductor region 101, a bottom backside contact 104, a topside contact 106, and a via hole 105 that has an open end 105a and a closed end 105b. The via hole 105 extends through the bottom backside contact 104 and one or more semiconductor layers of the semiconductor region 101 such that a bottom surface 106a of the topside contact 106 forms at least a portion of the closed end 105b of the via hole 105. In some embodiments, the bottom surface 106a of the topside contact 106 forms the entire closed end of the via hole 105. The via hole provides access to the bottom surface 106a of the topside contact 106 from a backside portion of the device 100. In some embodiments, a sidewall 116 is formed in the via hole 105 by at least a portion of an electrically insulating layer 110. In some embodiments, the device 100 also includes a transparent support 120 attached to the topside contact 106.

Figure 2:
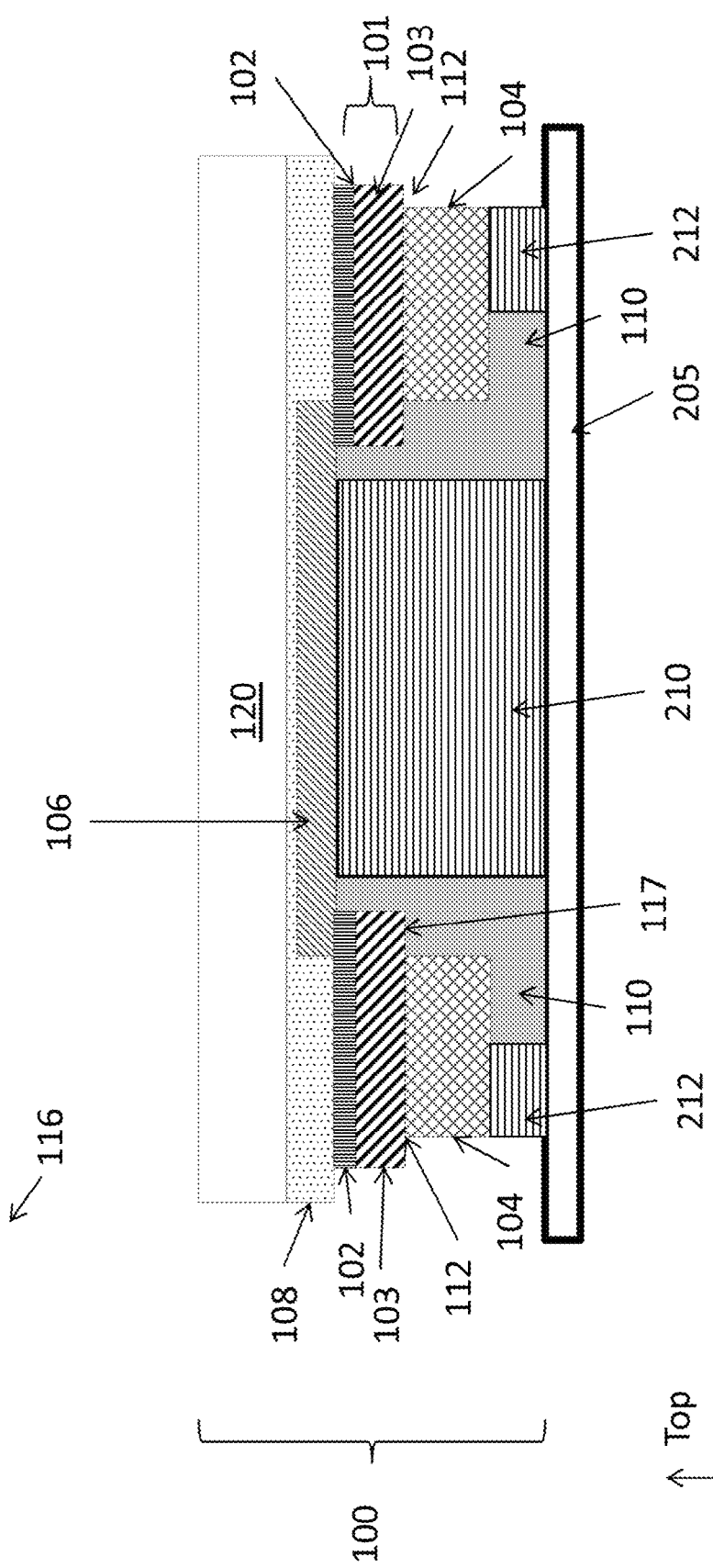
FIG. 2 schematically illustrates the thin film semiconductor device of FIG. 1 attached to a backplane in accordance with some embodiments of the present disclosure.

As shown in FIG. 2, when the thin film semiconductor device 100 is mounted to a backplane 205 (for example, in a device array), electrical contact is formed between the bottom surface 106a of the topside contact 106 and a portion of the backplane 205 and between the bottom backside contact 104 and a different portion of the backplane 205. In some embodiments, the thin film semiconductor device is or includes a thin film photovoltaic device such as a thin film solar cell device that generates an electric current when the top surface of the semiconductor region 101 is illuminated.

The semiconductor region 101 includes one or more semiconductor layers. One or more of the semiconductor layers includes a semiconductor material. In some embodiments, the one or more semiconductor layers can be grown epitaxially. In some embodiments, at least some of the semiconductor layers in the semiconductor region 101 can include at least one of GaAs, GaInAs, GaInAsP, InGaAlP, InGaP, InAlP, AlGaAs, AlGaAsP, InAlGaAs, InP, GaN, AlGaN, InGaN, InAlGaN, AN, Ge, or GaAsP. In some embodiments, the semiconductor region 101 can include an emitter region 102 and a base region 103. Each of the emitter region 102 and the base region 103 can include one or more of the semiconductor layers. In some embodiments, the semiconductor region 101 can form a component of a thin film III-V compound solar cell. In exemplary embodiments, one or more of the semiconductor layers can be active layers.

Although a single semiconductor region 101 is depicted in FIGS. 1-4, the concepts described herein can be generalized to tandem or multi-junction semiconductor devices or structures. For example, the thin film semiconductor device 100 can include two junctions (dual-junction), three junctions (triple-junction), four junctions (quad-junction), five junctions, or more than five junctions. In exemplary embodiments, the multiple junctions in the semiconductor region can be vertically stacked, i.e., the layers forming the junctions are grown or placed one atop the other between the top and bottom of the semiconductor device structure.

The topside contact 106 is disposed on a top surface of the semiconductor region 101. In some embodiments, the topside contact 106 (also known as a grid contact) can be in ohmic contact with the top surface of a topmost layer in the one or more semiconductor layers of the semiconductor region 101. In some embodiments, the topside contact 106 is in ohmic contact with the emitter region 102 of the semiconductor region 101. In some such embodiments, the topside contact 106 can collect photogenerated electrical carriers from the emitter region 102.

Figure 12:
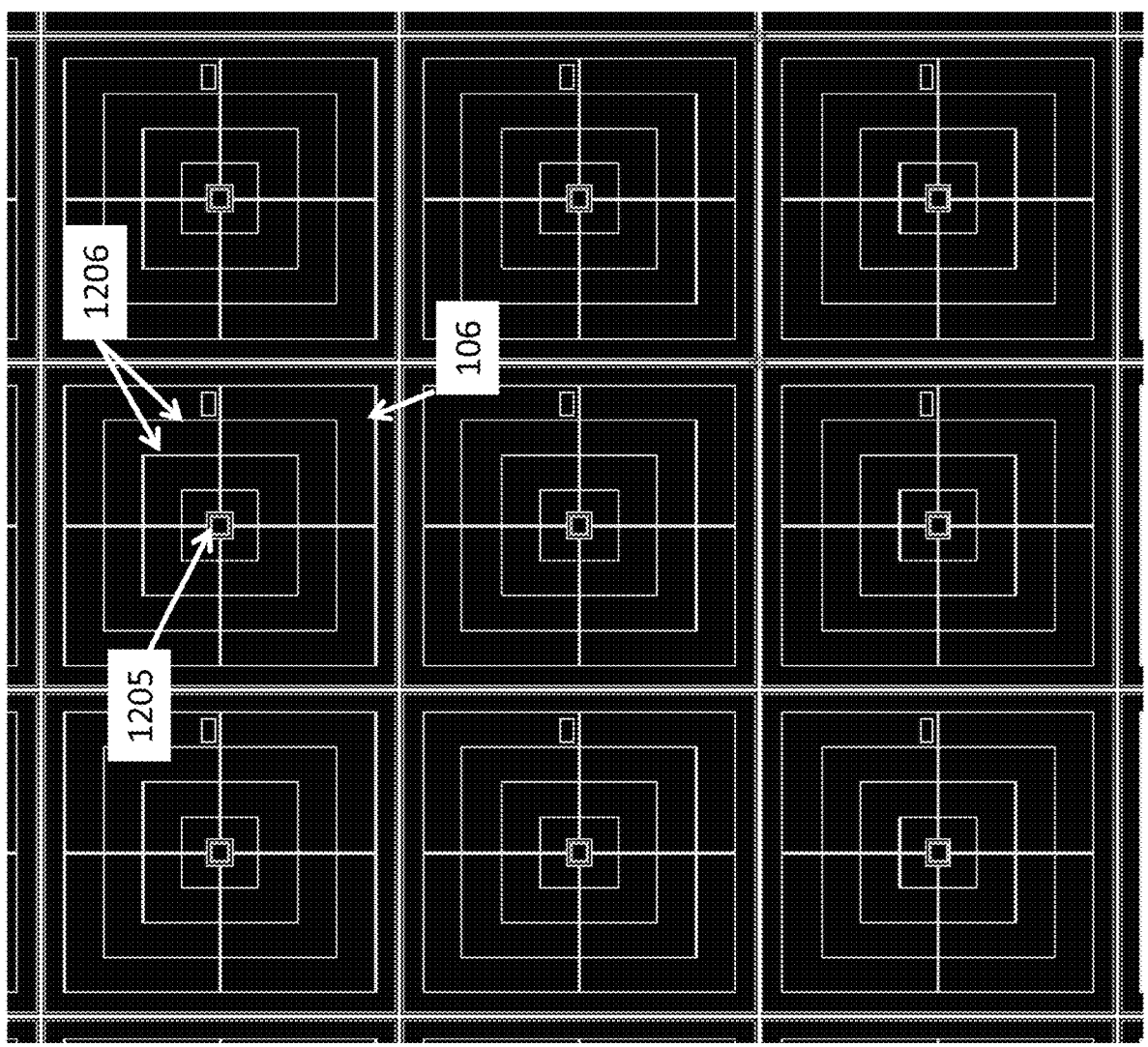
FIG. 12 depicts a plan view of a design showing nine devices, each having a central via hole that connects to a topside grid having a concentric format in accordance with some embodiments described herein.

The topside contact 106 can include an array of metal conductors (e.g., metal grid lines) connected to one or more metal via connection areas in some embodiments (see, e.g., grid lines 1206 and via connection area 1205 in FIG. 12). The metal via connection areas can be bond pads in some embodiments (see, e.g., bond pad 604 in FIG. 6a). In other embodiments, the metal via connection areas can include a metal grid line that is identical to the others in the array or, in some embodiments, is thicker than other metal grid lines in the array. In some embodiments, the size of the metal via connection area can be selected as a function of the accuracy of available device processing equipment. If the placement accuracy for the materials removal process to create the via hole 105 on the backside of the semiconductor device structure is low, it may be necessary to create a wider metal via connection area to ensure that the via hole and the metal via connection area are in contact in the final device. Because the topside contact 106 is deposited on the top surface of the semiconductor region 101, the topside contact 106 can shadow portions of the semiconductor region 101 and thus reduce the conversion efficiency of solar energy to electricity. In some embodiments, width and spacing of grid lines in the topside contact 106 can be chosen to reduce shadowing losses while also reducing electrical resistance losses within the contact. Selection of the size for the metal via connection area involves balancing shadowing of the top surface of the semiconductor region (which reduces efficiency) as the metal via connection area becomes larger with difficulty in meeting fabrication tolerance as the size of the metal via connection area becomes smaller. In some embodiments, a length, width, or diameter of the metal via connection area can be in a range of 5 μm to 200 μm. In some embodiments, the length, width, or diameter of the metal via connection area can be in a range of 5 to 10 has a length, width, or diameter of 100 μm.

The bottom backside contact 104 is disposed on a portion of the bottom surface of the semiconductor region 101. In some embodiments, the bottom backside contact 104 can be disposed on the bottom surface of the semiconductor region 101 facing away from the top surface of the semiconductor region 101. In some embodiments, the bottom backside contact 104 can be in ohmic contact with a bottom surface of a bottom-most layer in the one or more semiconductor layers of the semiconductor region 101. In some embodiments, the bottom backside contact 104 can be in ohmic contact with the base region 103 of the semiconductor region 101. In such embodiments, the bottom backside contact 104 can collect photogenerated carriers from the base 103. The bottom backside contact 104 can include metals or other electrically-conductive elements. In some embodiments, the bottom backside contact 104 can be deposited using at least one of thermal metal evaporation, electron beam evaporation, sputtering, plating, or any other suitable deposition method. In some embodiments, the bottom backside contact 104 can be patterned to form contact pads with sufficient spacing in between contact pads to minimize short-circuiting or metal migration between adjacent contact pads. In other embodiments, the bottom backside contact 104 can cover substantially the entire backside of the thin film semiconductor device 100. In some embodiments where the thin film semiconductor device generates light such as a laser diode or light emitting diode, the bottom backside contact 104 can be reflective to improve coupling of light out of the device.

In some embodiments, the thin film semiconductor device is free of a substrate on which the one or more semiconductor layers were formed. In some embodiments, a total thickness of the semiconductor region 101, the topside contact 106, and the bottom backside contact 104 can be in a range from 5 microns to 100 microns. In preferred embodiments, the total thickness of the semiconductor region 101, the topside contact 106, and the bottom backside contact 104 can be in a range from 10 microns to 20 microns, 30 microns, 40 microns, or 50 microns. In some embodiments, the total thickness of the semiconductor region 101, the topside contact 106, and the bottom backside contact 104 can be in a range from 20 microns to 30 microns, 40 microns, or 50 microns. In some embodiments, the total thickness of the semiconductor region 101, the topside contact 106, and the bottom backside contact 104 can be in a range from 30 microns to 40 microns or 50 microns. The use of thin film semiconductor devices such as those produced by semiconductor lift-off or other methods of substrate removal can improve yield results during lithographic patterning and material removal over the use of thick semiconductor device structures or semiconductor device structures that are attached to the substrate on which the one or more semiconductor layers were formed because of the difficulty in removing material through a narrow aperture at the end of a deep channel. In addition, thin film semiconductor devices can provide improved success rates for subsequent connection of the semiconductor device to a circuit board or backplane because electrically conductive material that is applied to form the connection between the backplane and the topside contact through the via hole does not need to be drawn up into a long, narrow channel.

In certain embodiments, the thin film semiconductor device 100 can include a transparent support 120. For example, the transparent support 120 can provide mechanical support to the thin film semiconductor device 100 while allowing illumination to pass through. For example, the transparent support 120 can allow solar energy to pass into the semiconductor device or can allow photons generated in the thin film semiconductor device to pass out. The transparent support 120 is attached to the topside contact 106 in some embodiments. In some embodiments, the transparent support 120 includes a glass or polymer substance. For example, in some embodiments, the transparent support 120 is a circular glass disk or clear polymeric material corresponding to the size of a wafer on which the semiconductor devices are positioned. In some embodiments, the transparent support 120 has a diameter of 4 inches, 6 inches, 8 inches, 10 inches, or 12 inches. In some embodiments, the transparent support 120 provides improved radiation hardness for space applications. In some embodiments, the thin film semiconductor device 100 does not include the transparent support 120 (e.g., in a purely electronic as opposed to an optoelectronic device). One of ordinary skill in the art would appreciate that the transparent support 120 is not limited to transparency in the visible range of wavelengths but can be substantially transparent in any appropriate range of optical energies for a given application.

As described in greater detail below with reference to FIGS. 3A-3D, the transparent support 120 can be applied at the wafer level to multiple thin film semiconductor devices 100 simultaneously. Attachment of the transparent support 120 to a full wafer of thin film semiconductor devices 100 can lower the cost of production with respect to applying transparent supports to individual cells after separation. In addition, the transparent support 120 can provide mechanical support and robustness to the thin film semiconductor device structure 100 during backside processing steps.

As noted above, in some embodiments, the transparent support 120 is attached to the thin film semiconductor device 100 using an adhesive layer 108. The adhesive layer 108 can include a transparent material. In some embodiments, the adhesive layer 108 has an index of refraction that is matched to the transparent support 120. In some embodiments, the transparent support 120 has a thickness in a range of 100 microns to 1000 microns. In some embodiments, the thickness of the transparent support 120 is about 500 microns. In some embodiments, the adhesive layer 108 includes a space-grade encapsulant. By bonding the semiconductor device to the transparent support 120, the stability of the semiconductor device is improved in preparation for the backside processing steps.

In exemplary embodiments, the via hole 105 can be formed in the thin film semiconductor device 100 such that the bottom surface 106a of the topside contact 106 forms at least a portion of the closed end 105b of the via hole 105. The via hole 105 allows access to the underside of the topside contact from a backside portion of the thin film semiconductor device 100. Exemplary methods to form the via hole 105 are described in greater detail below with reference to FIGS. 3A-3D. In some embodiments, the via hole 105 is formed, at least in part, by removal of material in the bottom backside contact 104 and the semiconductor region 101 in a targeted fashion. In some embodiments, the material removal process includes wet etching, dry etching, laser ablation, or any combination of these methods or other suitable methods. Although many embodiments depicted and described herein discuss a single via hole, exemplary embodiments can include one or more additional via holes. By providing multiple via holes within the semiconductor device, the distance from any portion of the topside contact 106 to a via hole is reduced, which also reduces ohmic losses due to series resistance in the topside contact 106.

In some embodiments, the via hole 105 can be slightly larger than the diameter of the portion of the topside contact that forms the closed end 105b of the via hole 105. For example, in embodiments where the topside contact 106 includes thin grid lines, the diameter of the via hole 105 at the closed end 105b may be larger than a width of the grid line. In such a case, the bottom surface 106a of the topside contact 106 forms only a portion of the closed end 105b of the via hole 105. In some embodiments, the bottom surface 106a of the topside contact 106 forms the entire closed end 105b of the via hole 105.

In some embodiments, material removal processes can remove a portion of the topside contact 106 in addition to removing portions of the semiconductor region 101 or bottom backside contact 104. Removal of material in the topside contact 106 may be intentional or may be incidental as a result of inherent variability in materials processing. As a result, one of ordinary skill in the art would appreciate that the bottom surface 106a of the topside contact 106 can be level across the structure or may include depressions, recesses, or other features.

In some embodiments, an aspect ratio of a depth 118 of the via hole 105 to a diameter, width, or length 119 of the via hole 105 to can be in a range from 1:1 to 1:70. In exemplary embodiments, the aspect ratio can be in a range from 1:10 to 1:50. In an exemplary embodiment, the thin film semiconductor device can be 12 µm thick and the length, width, or diameter of the via hole can be in a range from 150 to 400 µm resulting in an aspect ratio of between 1:12 and 1:33. The aspect ratio of the via hole 105 can affect the properties of an electrical contact such as an anode contact 210 that is later formed through the via hole 105 to contact the topside contact 106. For example, a low aspect ratio in the via hole 105 can reduce resistance of the electrical contact formed therethrough. In some embodiments, a low aspect ratio can simplify materials processing. For example, a low aspect ratio via hole can simplify a step of removing the electrically insulating layer 110 from the closed end 105b of the via hole 105 as described below. In addition, electrically probing or testing completed devices is easier when the aspect ratio of the via hole 105 is low. In some embodiments, a low aspect ratio via hole is easier to fill with solder paste or other conductor during panel assembly as described below.

Shunts can be caused by conductive paths between metal contacts through surface contaminants or electromigration. In some embodiments, the via hole 105 can include a ledge 117. For example, the ledge 117 can be formed by etching in two separate stages and offsetting the second etch through the semiconductor region 101 at a distance from the edge of the etch through the bottom backside contact 104. The ledge can reduce shunting by increasing the distance between the topside contact 104 and the bottom backside contact 106.

In accordance with various embodiments, the electrically insulating layer 110 can be applied at the location of the removed portions of the via hole 105 to cover, at least, side surfaces of the bottom backside contact 106 and the semiconductor region 101 to form a sidewall surface 116 of the via hole 105. In some embodiments, the electrically insulating layer 110 includes a solder mask material. The solder mask material can be configured to control the flow or spread of conductive solder or adhesives during mounting of the thin film semiconductor device 100. By controlling flow of the conductive solder or adhesives, the electrically insulating layer 110 can prevent shorts from forming near the ledge 117 or between anode contacts 210 and cathode contacts 212. In some embodiments, the electrically insulating layer 110 can be applied to the thin film semiconductor device structure 100 using methods including, but not limited to, screen printing, stencil printing, ink jet patterning, or photolithographic patterning. In some embodiments, the electrically insulating layer 110 is configured to draw in a liquid solder material such that the liquid solder makes electrical contact with the topside contact 106. In some embodiments, the electrically insulating layer 110 is configured to prevent the liquid solder material within the via hole 105 from directly contacting the bottom backside contact 104 and the semiconductor region 101. The electrically insulating layer 110 can include a polymer, an epoxy, an acrylic, or an oxide in some embodiments. In embodiments where the semiconductor device includes multiple via holes, the electrically insulating layer 110 can be applied to cover, at least, side surfaces of the bottom backside contact 104 and the semiconductor region 101 in each via hole to form a sidewall surface of the respective via hole. In some embodiments, the electrically insulating layer 110 can be applied over all surfaces within the via hole 105 including the closed end 105b. Then, the electrically insulating layer 110 can be removed from the closed end 105b in a subsequent step to allow conductive contact to be made to the bottom surface 106a of the topside contact 106. In some embodiments, the thin film semiconductor device 100 does not include the electrically insulating layer 110. These embodiments are described in more detail below with reference to FIG. 2.

In some embodiments, the electrically insulating layer 110 can have a first width 131 at the via hole 105 as measured between the sidewall surface 116 and a side surface of the bottom backside contact and a second width 132 as measured between the sidewall surface 116 and a side surface of the semiconductor region 101. In some embodiments, the second width 132 can be smaller than the first width 131. In some embodiments, the electrically insulating layer 110 can have a first outer diameter 133 at the via hole 105 as measured at the interface between the electrically insulating layer 110 and the side surface of the bottom backside contact 104 and a second outer diameter 134 as measured at the interface of the electrically insulating layer 110 and the semiconductor region 101. In embodiments without an electrically insulating layer 110, the first outer diameter 133 can be the narrowest extent of the opening within the bottom backside contact 104 while the second outer diameter 134 can be the narrowest extent of the opening within the semiconductor region 101. In some embodiments, the first outer diameter 133 can be larger than the second outer diameter 134. In some embodiments, the first outer diameter 133 can be between 25 microns and 1000 microns. In some embodiments, the first outer diameter 133 can be in a range between 25 microns and 500 microns. In some embodiments, the first outer diameter 133 can be in a range between 25 microns and 900 microns Some embodiments of the thin film semiconductor device 100 can include an isolation trench 112 to provide edge isolation. For example, the isolation trench 112 can provide additional protection against shunts between the emitter 102 and the bottom backside contact 104. In some embodiments, the isolation trench 112 can assist in isolating one thin film semiconductor device 100 from a neighboring thin film semiconductor device when multiple devices are produced on a single wafer. By electrically isolating each device, device testing can be performed at the wafer level. In some embodiments, the thin film semiconductor device 100 does not include an isolation trench 112 and the devices can be separated (e.g., by dicing or sawing) and tested individually.

FIG. 2 schematically illustrates the thin film semiconductor device 100 attached to a backplane 205 in accordance with embodiments of the present disclosure. In various embodiments, a conductive material such as solder or conductive paste can create a conducting pathway through the via hole 205 to electrically connect the backplane 209 and the bottom surface 106a of the topside contact 106. In some embodiments, the conductive material can form the anode contact 210. Advantageously, the anode contact 210 enables electrical readout of the topside contact 106 directly at the backplane 205. Because the backplane 205 is generally accessible and does not block illumination to the semiconductor device 100, readout at the backplane 205 is preferable to alternatives such as links around the exterior of the semiconductor device. Likewise, conductive material can be used to create a conducting pathway between the bottom backside contact 104 and the backplane 205. In some embodiments, the conductive material can form the cathode contact 212.

In exemplary embodiments, the thin film semiconductor device 110 includes the electrically insulating layer 110. As depicted in FIG. 2, the electrically insulating layer 110 can not only cover side surfaces of the bottom backside contact 104 and semiconductor region 101 but can also cover a portion of the backside of the bottom backside contact 104 adjacent to the via hole 105. In this way, the electrically insulating layer 110 can isolate the anode contact 210 from the cathode contact 212 in some embodiments. In other words, the electrically insulating layer 110 can prevent shorting between oppositely charged contacts at the backplane 205. This arrangement is particularly useful in certain assembly operations as the requirements for placement accuracy can be relaxed while still maintaining separation between the conductive material that forms the anode contact 210 and the cathode contact 212. For example, the backplane can include conductive material in the form of balls or posts of solder. When the semiconductor device is aligned with the backplane and heated, the solder can flow to form the anode contact 210 and the cathode contact 212. The electrically insulating layer 110 can prevent flow of the heated solder between the anode contact 210 and the cathode contact 212.

In some embodiments, the thin film semiconductor device 100 does not include an electrically insulating layer 110. In such embodiments, careful placement of the conductive material that forms the anode contact 210 and the cathode contact 212 can prevent shorting. For example, the anode contact 210 can contact only the backplane 205 and the topside contact 106 and does not contact the semiconductor region 101 or the bottom backside contact 104 in some embodiments. In various embodiments, the thin film semiconductor device 100 can be connected to a circuit board or other common backplane that enables the semiconductor device 100 to interconnect with other electrical devices and systems. For example, the bottom backside contact 104 of the semiconductor device 100 can be connected to a first bond pad of the backplane while the topside contact 106 can be connected to a second bond pad of the backplane by applying an electrical conductor through the via hole 105. In some embodiments, the electrical conductor can be formed from a solder bump, ball, or pillar. In some embodiments, the electrical conductor can include a wire bond or a weld.

In some embodiments, the electrical conductor can include conductive epoxy, conductive adhesive, or sintered silver paste. In some embodiments, the circuit board or common backplane is flexible.

Figure 3C:
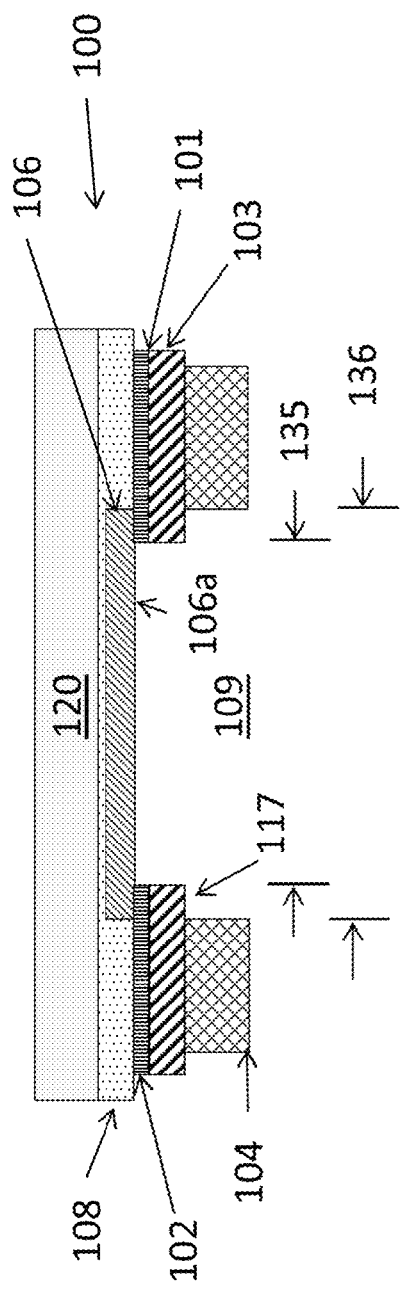
FIG. 3C illustrates the structure of FIG. 3B after a step in the process of producing a thin film semiconductor device in accordance with some embodiments of the present disclosure.

FIGS. 3A-3D illustrate steps in a process of producing a thin film semiconductor device in accordance with embodiments of the present disclosure. FIG. 3A shows a cross-sectional view of a thin film semiconductor structure 99a including the base region 103 and emitter region 102 that collectively form a semiconductor region, a topside contact 106, and a bottom backside contact 104. In exemplary embodiments, the thin film semiconductor structure 99a is provided free of a substrate on which the one or more semiconductor layers were formed. Although a single junction is depicted in FIG. 3A, one of ordinary skill in the art would appreciate that the disclosed approach can be applied to multi-junction semiconductor device structures having two, three, four, five, or more stacked junctions in the semiconductor region.

In some embodiments, the method includes forming the structure of FIG. 3A. In some embodiments, forming the thin film semiconductor structure of FIG. 3A includes providing a substrate and forming a sacrificial layer on the substrate. Then, the semiconductor region 101 is formed over the sacrificial layer. Next, the bottom backside contact 106 is formed over the semiconductor region 101. The sacrificial layer is removed to separate the semiconductor region and bottom backside contact from the substrate. The topside contact 104 is formed over the semiconductor region 101. Formation of an exemplary thin film semiconductor structure 99a compatible with the processing steps depicted in FIGS. 3A-3D is described in greater detail below with reference to FIG. 4.

FIG. 3B illustrates the addition of the transparent support 120 to the thin film semiconductor structure 99a. As described above, a single transparent support 120 can be attached simultaneously to a large number of structures that were all formed together on the same substrate. In conventional systems, the transparent support 120 is added to each individual structure or each individual device after dicing, which is labor-intensive, complex, expensive, and has a high loss rate. As described above, the transparent support 120 can be affixed to the thin film semiconductor structure using the adhesive layer 108.

Figure 3D:
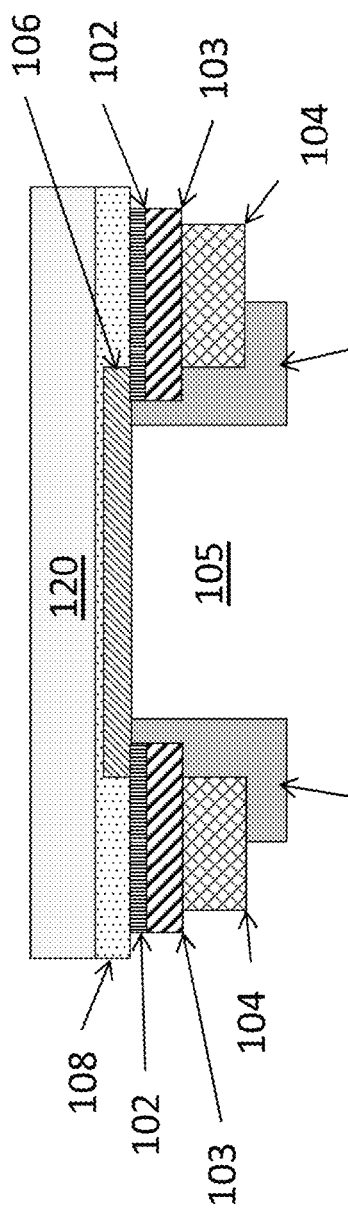
FIG. 3D illustrates the structure of FIG. 3C after an optional step in the process of producing a thin film semiconductor device in accordance with some embodiments of the present disclosure.

The results of backside processing steps are shown in FIGS. 3C-3D. FIG. 3C illustrates the resulting thin film semiconductor device 100 after removal of material through the bottom backside contact 104 and the semiconductor region 101. As described above, the material can be removed using techniques such as wet etching, dry etching, or laser ablation, alone or in any suitable combination. Material removal can proceed in a single step or in two or more steps as appropriate. By removing material in multiple steps or stages, the ledge 117 can be formed to improve electrical isolation and reduce shorting or shunting between the topside contact 106 and the bottom backside contact 104. For example, the second stage of material removal can include a patterned etch through the semiconductor region 101 that is offset a selected distance from the edge of the first etch. In some embodiments, photolithography and wet etching can be used in two steps. First, a rectangular window can be patterned on the backside of the thin film semiconductor device structure 99a using a front-to-back alignment to the topside contact. Wet etching can be used to etch the back metal of the bottom backside contact down to the backside surface of the semiconductor region 101. A second lithography and wet etch step can be used to etch the via hole 105 through the semiconductor region 101 to the topside contact 106. The resulting devices or structures can then be cleaned using acetone and isopropyl alcohol (IPA) to remove photoresist and can be dried with nitrogen before proceeding to next steps.

FIG. 3D illustrates the thin film semiconductor device 100 after application of the electrically insulating layer 110 to form sidewalls in the via hole 105. The deposition of the electrically insulating layer 110 such as a dielectric layer on side surfaces of the bottom backside contact and the semiconductor region in the via hole can facilitate passivation in some embodiments.

Figure 4:
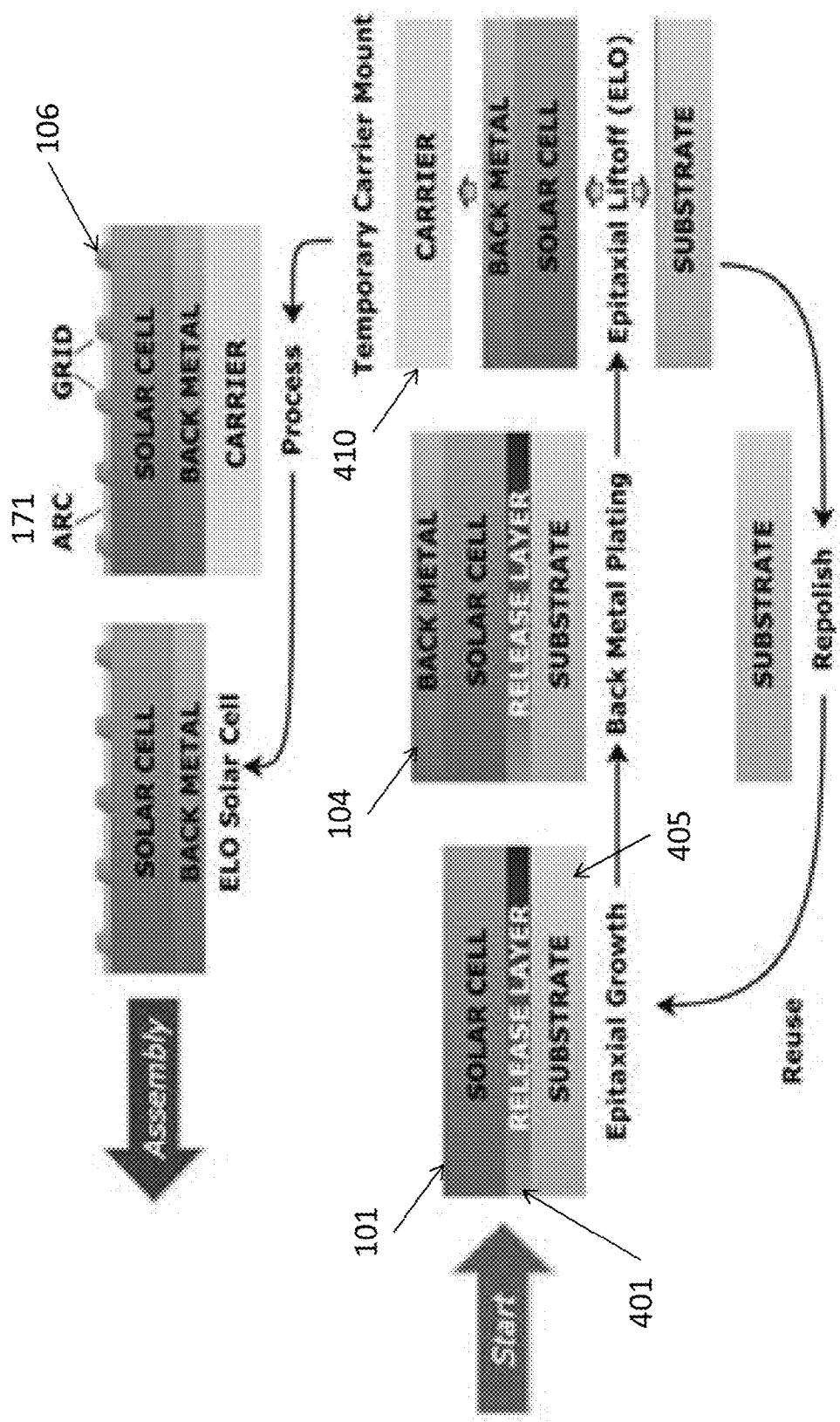
FIG. 4 illustrates an exemplary process flow for production of multi-junction solar cells using an epitaxial lift-off methodology consistent with some embodiments described herein.

FIG. 4 illustrates an exemplary process flow for production of multi-junction solar cells using an epitaxial lift-off methodology consistent with some embodiments described herein. To begin, a release layer 401 is grown on a substrate. One or more semiconductor layers are deposited onto the release layer to form one or more active layers in a semiconductor region, which is labeled "solar cell" in FIG. 4. The semiconductor region of the solar cell can include one or more junctions in various embodiments. During a back metal plating step, the bottom backside contact 104 is deposited onto the semiconductor region 101. In some embodiments, conventional electron-beam evaporation and plating methods can be used to form the ohmic contact (i.e., the bottom backside contact 104) before peeling the thin film semiconductor structure off the substrate using an epitaxial lift-off process. In some embodiments, the ohmic contact can also be a thick structural support layer. The epitaxial lift-off process is then employed to remove the release layer 401, thus releasing the thin film semiconductor structure from the substrate.

In some embodiments of the epitaxial lift-off process, after being released from the substrate, the thin film semiconductor structure is mounted onto a temporary carrier mount 410 at the bottom backside contact 104 for further processing. Once removed, the substrate 405 can be re-polished and reused to begin the process anew to generate additional thin film semiconductor structures. Reuse of the substrate 405 can substantially reduce waste and costs associated with wafer processing, particularly in the case where the substrate 405 is made of an expensive material.

The thin film semiconductor structure attached to the temporary carrier mount 410 can then be inverted for further processing. Next, the topside contact 106 can be applied to or formed on the side of the structure opposite the temporary carrier mount 410 in some embodiments. As described above, the topside contact 106 includes a metal grid in some embodiments. For example, the grid metal can be deposited using photolithography and electron-beam evaporation. In some embodiments, an anti-reflection coating (ARC) 171 can be applied to the topside contact and exposed portions of the top surface of the semiconductor region 101. Structures for multiple thin film semiconductor devices can be formed simultaneously on a large wafer (e.g., a 4-inch, 6-inch, or 8-inch wafer). In some embodiments, individual thin film semiconductor structures for different devices on the large wafer can be isolated by wet chemical etching. An anti-reflection coating can be deposited onto the topside contact 106 and exposed portions of the semiconductor region 101 using electron beam evaporation, and the die can be singulated using conventional production processes. Finally, the temporary carrier mount 410 is removed from the thin film semiconductor structure. The thin film semiconductor structure can now be subjected to the via hole production process described above with reference to FIGS. 3A-3D.

FIGS. 5A and 5B illustrate top and bottom views, respectively, of an exemplary thin-film solar cell semiconductor device produced according to some embodiments described herein. The depicted solar cell device was produced using epitaxial lift-off and is an inverted metamorphic multi-junction structure. Six-inch foils were manufactured with solar cell devices each having an area of 1 $cm^2$. At the top of FIG. 5A, the metal via connection area 606 of the topside contact 106 is visible in the form of a bond pad. It is noted that the metal grid of the topside contact 106 is too fine to be observed at the resolution of this image. The indentation seen on the metal via connection area 606 in FIG. 5A was created by contact with an electrical probe during testing before the image was acquired. In the image in FIG. 5A, the device is 10 mm on a side. FIG. 5B shows the rectangular through-epi via hole 105 penetrating from the backside of the thin film semiconductor device, the through-epi via hole 105 having a closed end formed by the metal via connection area 606 shown in FIG. 5A. In this instance, the via hole 105 was formed using a two-step etching process as is evident from the two concentric, rectangular borders around the via hole 105 in FIG. 5B. In the example shown in FIG. 5B, the via hole is of the order of millimeters on a side for demonstration purposes.

Figures 6A, 6B:
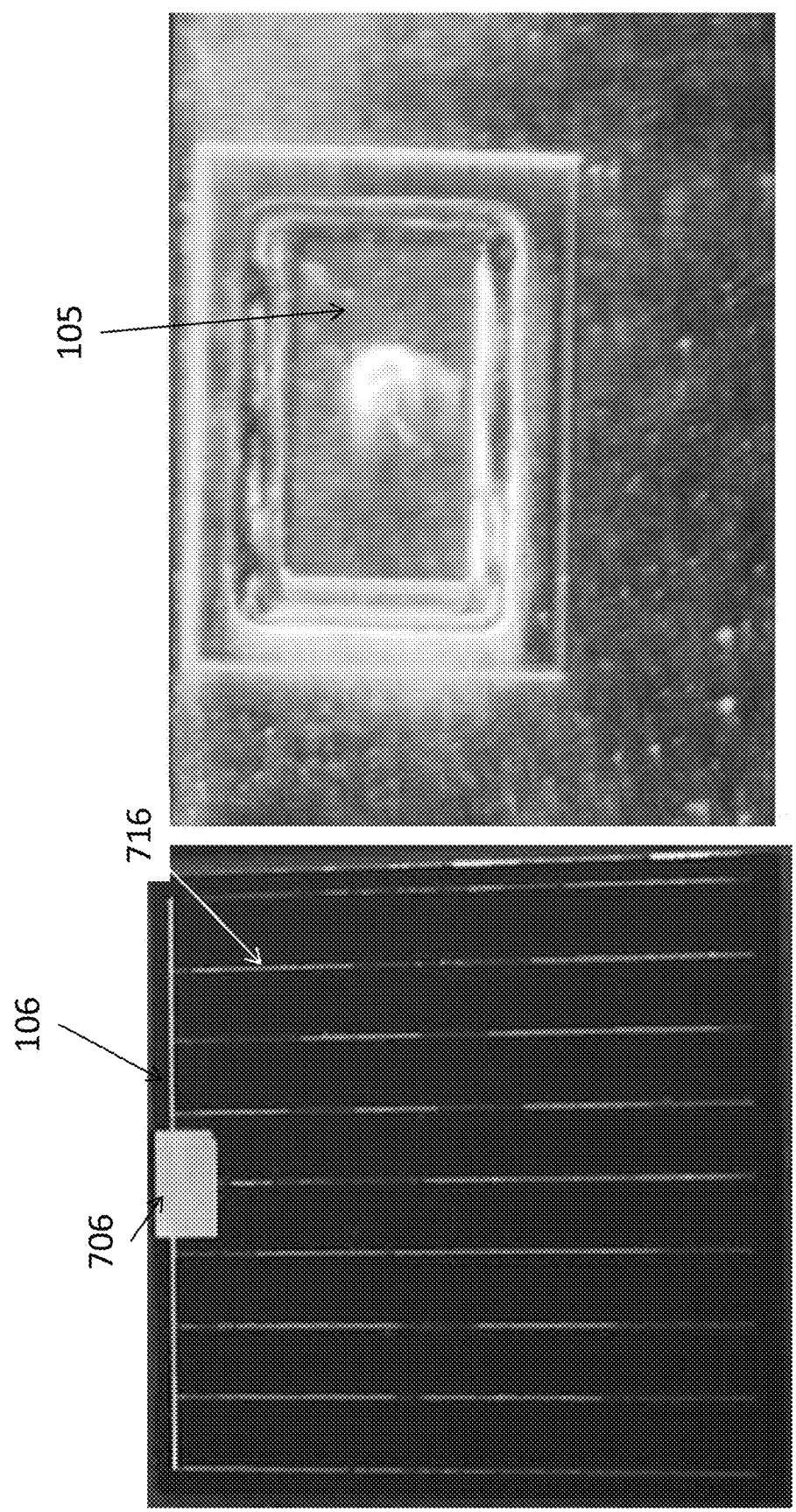
FIG. 6A illustrates the front side of an example back-contact semiconductor device with a through-epi via produced in accordance with some embodiments described herein.
FIG. 6B illustrates the back side of the semiconductor device of FIG. 6A.

Similar to FIGS. 5A and 5B, FIGS. 6A and 6B illustrate the front and back sides, respectively, of a different exemplary back-contact solar cell with a through-epi via produced in accordance with some embodiments described herein. It is noted that the indentation visible within the via hole 105 in FIG. 6B was caused by contact with an electrical probe during device testing (discussed further below). In FIG. 6A, both the bond pad 706 and grid lines 716 of the topside contact 106 are visible. Optical microscope inspection showed that the through-epi via holes were clean and damage-free before electrical characterization.

Figure 7B:
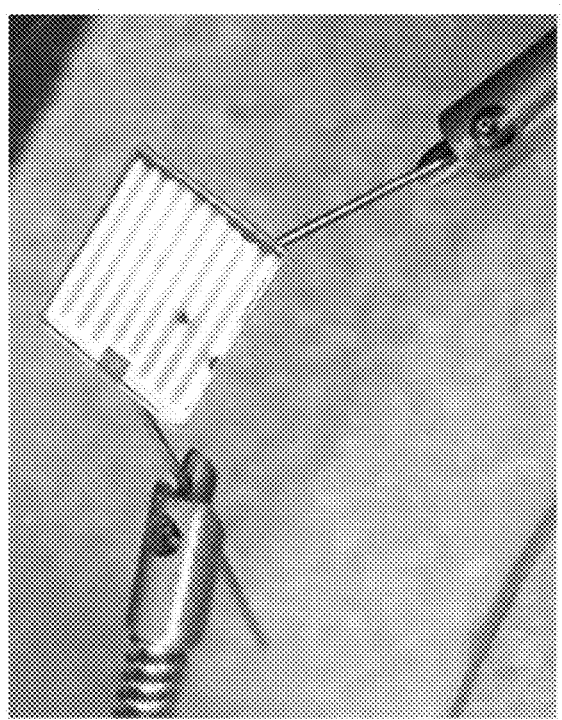
FIG. 7B depicts an example solar cell including through-epi via holes in accordance with some embodiments described herein as it emits electroluminescence.
Figure 7A:
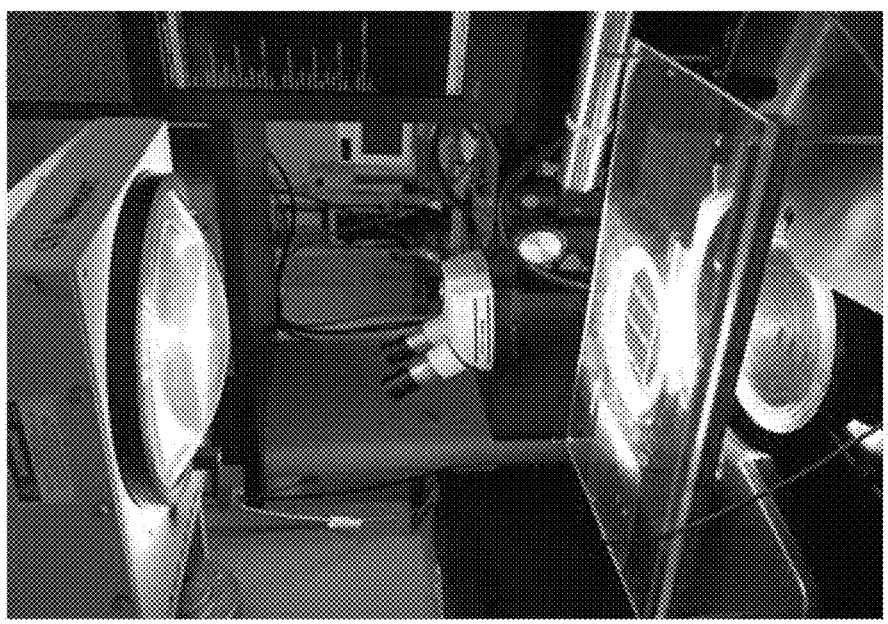
FIG. 7A depicts back contacts of solar cells formed on a 6-inch wafer being tested on a back-contact testing station using a single-zone Newport solar simulator.

FIG. 7A depicts a back-contact testing station wherein a 6-inch wafer of example solar cells such as that shown in FIGS. 6A and 6B was tested using a single-zone Newport solar simulator (Newport Corporation, Irvine, Calif.). The testing jig had a six-inch window and magnetic plates to hold the probes upside-down to accommodate contact with the probes and the backside of the semiconductor device during testing. As shown in FIG. 7B, the electroluminescence obtained from the cells was uniform.

Figure 8:
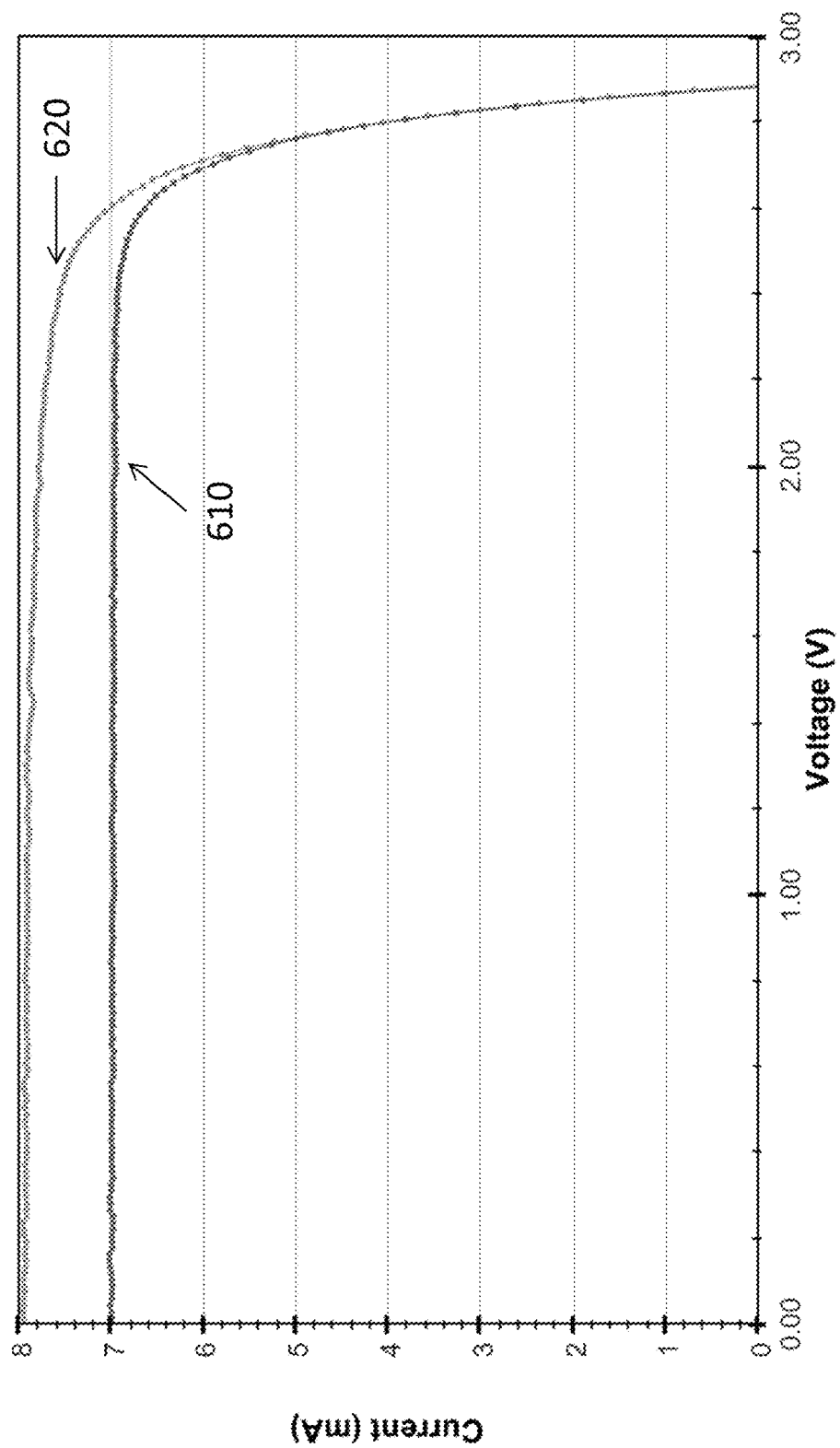
FIG. 8 illustrates the current-voltage characteristic for an exemplary thin film semiconductor device having the configuration shown in FIGS. 5A and 5B in accordance with some embodiments described herein under one-sun AM1.5 illumination for different probe geometries.
Figure 9:
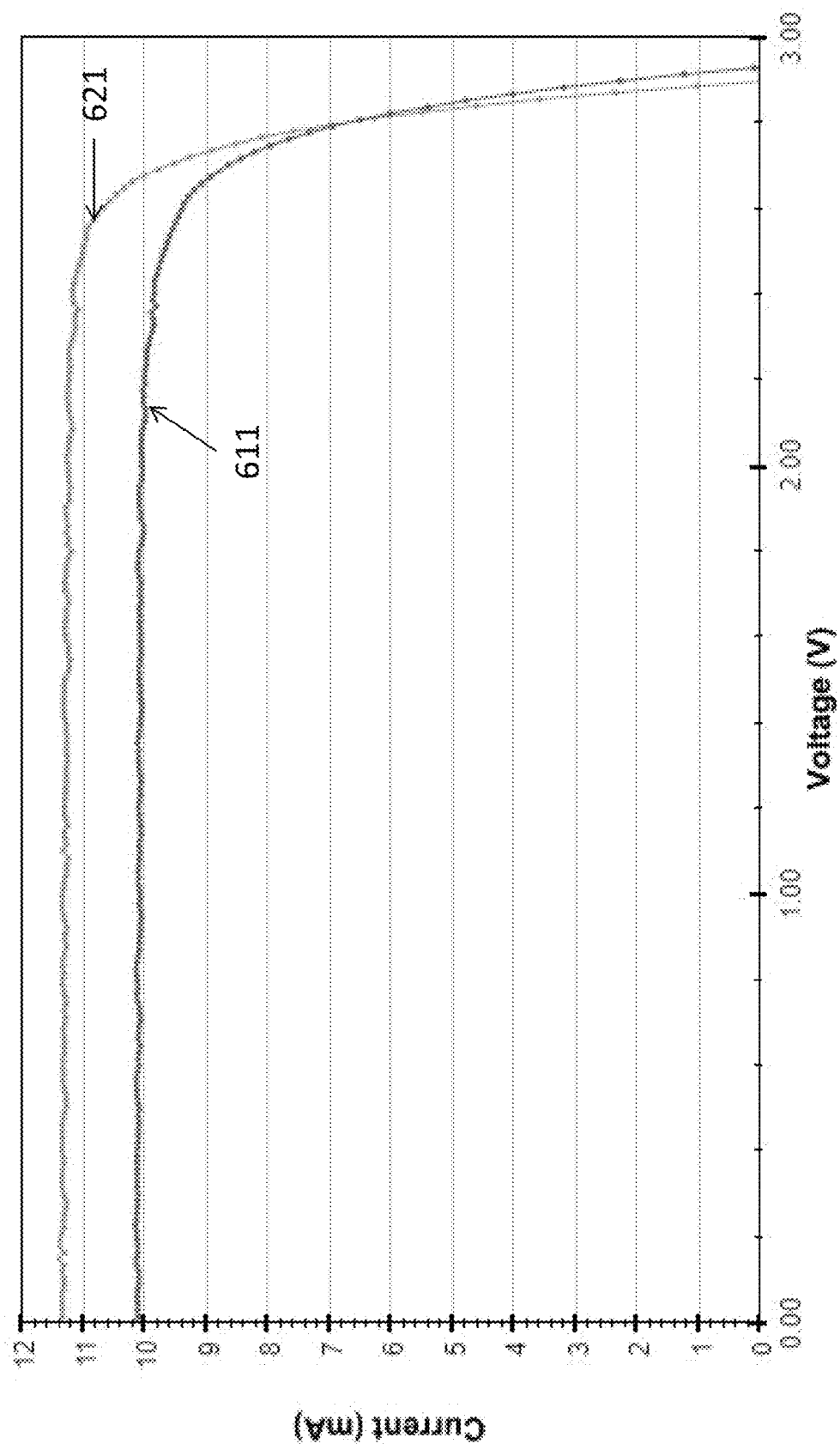
FIG. 9 illustrates the current-voltage characteristic for an exemplary thin film semiconductor device having the configuration shown in FIGS. 6A and 6B in accordance with some embodiments described herein under one-sun AM1.5 illumination for different probe geometries.

FIGS. 8 and 9 illustrate the current-voltage characteristic for exemplary semiconductor devices produced as described herein under one-sun AM1.5 illumination for different probe geometries. The data in FIG. 8 was obtained using devices of the configuration shown in FIGS. 5A and 5B. The data in FIG. 9 was obtained using devices of the configuration shown in FIGS. 6A and 6B. To produce the two plots shown in each figure, measurements were conducted at two different probe geometries at different stages of processing for a single semiconductor device. First, the current-voltage characteristic of the topside grid contact was probed by directly contacting bond pads of the topside contact (line 610, 611) before backside processing consistent with FIGS. 3A-3D was commenced. Then, the same characteristic was measured by contacting the anode contact passing through the via hole on the backside of the semiconductor device (line 620, 621) after backside processing was completed. The apparent increase in current in lines 620, 621 as compared to respective lines 610, 611 is due to the expected improvement in reflectivity due to the application of the transparent support and encapsulant because no anti-reflection coating was applied to this prototype semiconductor device. Under AM1.5 illumination, the solar cell semiconductor device of FIGS. 5A and 5B exhibited an efficiency of 24.6% with $J_{sc}$=10.57 mA/cm$^2$, $V_{oc}$=2.89 V, and a fill factor of 80.7 while the solar cell semiconductor device of FIGS. 6A and 6B exhibited an efficiency of 25.9% with $J_{sc}$=10.52 mA/cm$^2$, $V_{oc}$=2.9 V, and a fill factor of 84.87. The semiconductor devices exhibit very similar performance (i.e., minimal degradation in semiconductor device performance) when measured from before to after backside processing after accounting for the differences in reflectivity resulting from application of the transparent support. Further improvements in efficiency can be expected by reducing the side of the bond pads of the topside contact, optimizing grid coverage, and applying an antireflection coating. It is anticipated that these changes could provide an additional increase in current of ~18%.

Figure 10:
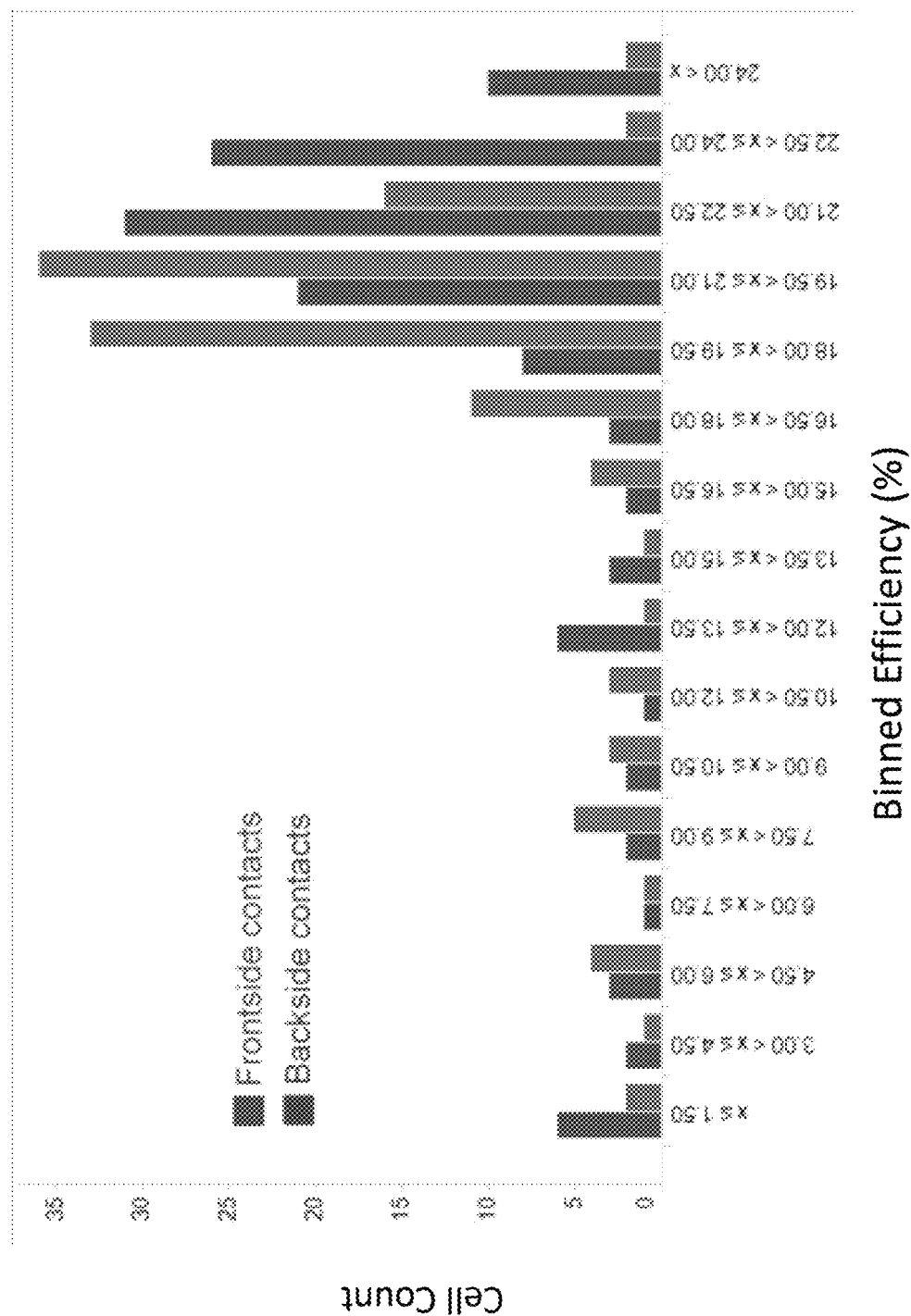
FIG. 10 includes a histogram showing binned efficiency versus number of cells for the same population of cells before and after backside processing for an example semiconductor device design in accordance with some embodiments.

FIG. 10 illustrates a histogram showing binned efficiency versus number of cells for the same population of solar cells before and after backside processing. The six-inch wafer yielded 121 through-epi via back-contact 1-cm$^2$ cells. Yield as a measure of percentage of cells that changed in efficiency by ±10% during backside processing was calculated to be approximately 75%. As shown in the plot, most of the cells that yielded were in the 20% to >24% efficiency bins.

In accordance with some embodiments described herein, microelectronic semiconductor devices 100 can be connected together to produce larger systems. For example, a solar power system can be assembled that includes multiple thin-film solar cell semiconductor devices connected to a circuit board. To assemble microelectronic semiconductor devices as described herein, a variety of methods can be used depending upon the type of semiconductor device. In the case of solar cells, application of the electrically insulating layer 110 can include application of a photo-defined dielectric to the side surfaces of the via holes. Subsequently, the solar cells can be laid down to a metallized polyimide (e.g., KAPTON) sheet. This assembly method allows for a very simple and automated panel assembly approach. For example, photoresist and standard photolithography techniques can be used to pattern the dielectric (i.e., the electrically insulating layer 110) and silver epoxy for die attach. For further testing, a 1×3 array was created with this method although other array configurations are contemplated depending upon application-specific considerations. In various embodiments, the circuit board to which one or multiple semiconductor devices are attached may be rigid or flexible. The circuit board can include electrical conductors that interconnect the solar cells into an array. For example, the electrical conductors can interconnect the topside contacts of each thin film semiconductor device and the bottom backside contacts of each thin film semiconductor device. The electrical connections between the electrical conductors of the circuit board and the bottom backside contacts and topside contacts (through the via hole) of the semiconductor device can be made using any suitable method including solder, conductive paste, conductive epoxy, conductive adhesive, sintered silver paste, wire bonds, or welded connections. In some embodiments, the solar power system can include a concentrator to concentrate light onto at least one of the thin film semiconductor devices.

Figure 11:
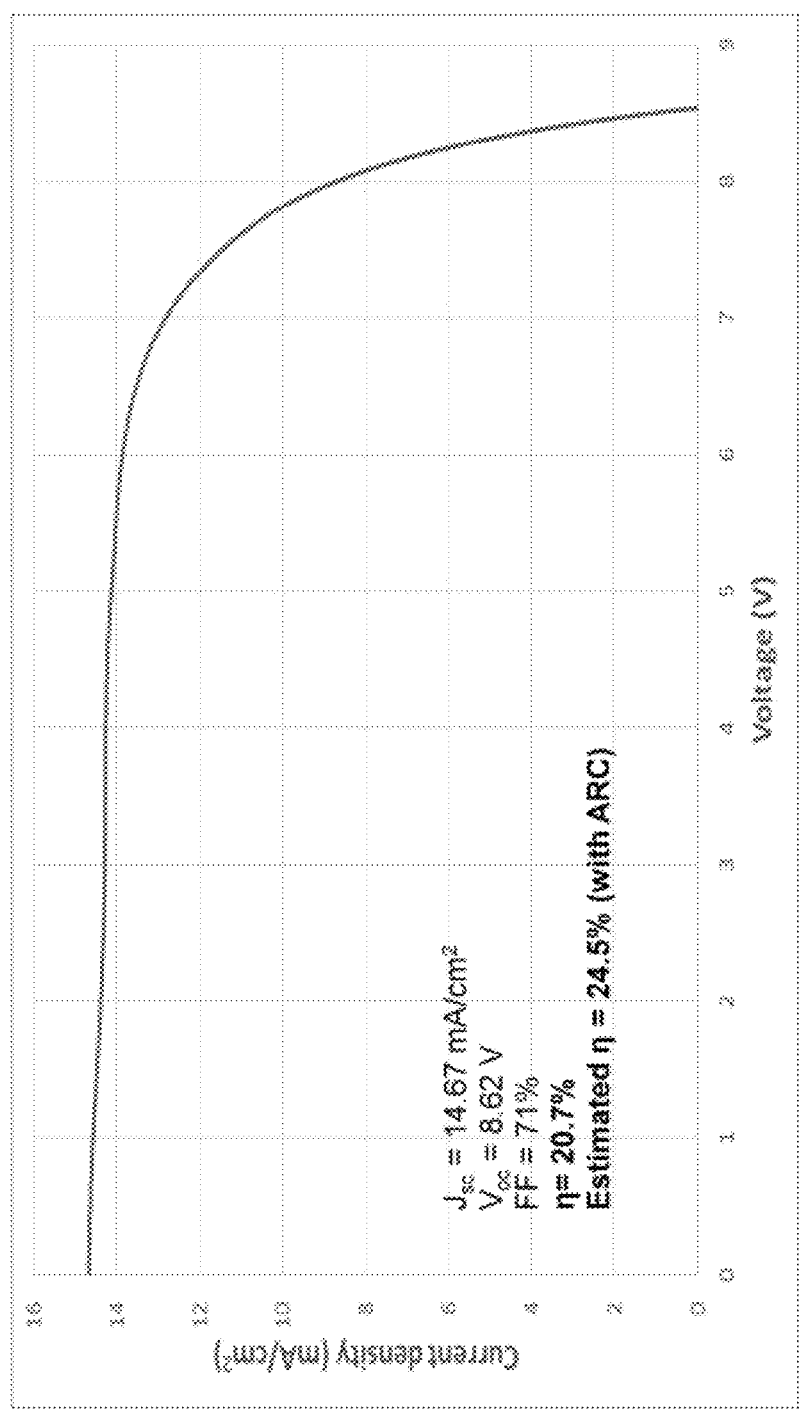
FIG. 11 includes a graph of the results of a calibrated AM0 measurement of current-voltage characteristics for a 1×3 array of solar cells with through-epi via holes for an example semiconductor device design in accordance with some embodiments described herein.

FIG. 11 illustrates the results of a calibrated AM0 measurement of the current-voltage characteristics for a solar power system including a 1×3 array of thin-film solar cell semiconductor devices having through-epi via holes in accordance with embodiments described herein. The measurement was conducted using a TS-Space three-zone solar simulator (TS-Space Systems, Marlow, England). The array yielded an efficiency of 20.7% with Jsc=14.67 mA/cm$^2$, $V_{oc}$=8.62 V, and a fill factor of 71%. It is anticipated that the addition of an anti-reflective coating would improve the efficiency of this array to 24.5%. A nine-cell, 3×3 array was also fabricated and tested (not shown) and obtained an efficiency of 18.96%. Overall, it is anticipated that optimization of the die attach process can enable further increases in efficiency in the face of challenges such as fill factor and series resistance.

In accordance with various embodiments, the circuit board connected to one or more thin film semiconductor devices as described herein can also be connected to other thin film semiconductor devices. The circuit board can facilitate connection between the thin film semiconductor devices on the board. For example, the circuit board can include one or more bypass diodes. Bypass diodes are diodes that can be placed in parallel with one or more photovoltaic devices such as solar cells. Bypass diodes can alleviate issues with solar cell arrays that can arise when some of the solar cell devices are shadowed. In such an instance, the shadowed cell or cells become like an open circuit, and illuminated cells in the array that are still generating current encounter increased resistance to push the current to the output. In addition, a voltage can build up across the shadowed solar cell that can damage the cell in some instances. Bypass diodes can allow current to bypass the solar cell thus avoiding these problems. In some embodiments, the bypass diodes can be fabricated to include backside contacts facilitated by through-epi via holes as described herein. In some embodiments, a first thin film semiconductor device in the form of a bypass diode and a second thin film semiconductor device in the form of a solar cell can be formed adjacent to one another and may share components in common such as the bottom backside contact.

In some embodiments, the topside contact and via hole can be patterned or arranged in such a way as to reduce series resistance. The topside grid metallization collects photocurrent generated across the top surface of the solar cell. The topside grid conductors have an associated series resistance that increases with the square of the length of the grid metal conductors. The electrical losses related to this series resistance can be minimized by reducing the length of the grid lines. In some embodiments, the metal via connection area 1205 of the topside contact 106 can be placed at an interior of the semiconductor device to reduce the length of grid lines 1206 in the topside contact and accordingly reduce series resistance. Likewise, the via hole 105 can be placed at the interior of the semiconductor device to be in contact with the metal via connection area 1205 of the topside contact 106. For example, the metal via connection area 1205 and the via hole 105 can be disposed in a central region of the semiconductor device away from an edge of the semiconductor device. In accordance with various embodiments, the grid lines 1206 can be placed concentrically with radial spokes extending from the metal via connection area 1205 to the edge of the semiconductor device. Conventionally, a solar cell with topside contacts often has a busbar along one or multiple edges of the solar cell to which the grid lines connect. The busbar is conventionally positioned at the edge of the cell to facilitate interconnection of the topside contacts of multiple adjacent cells. However, positioning the busbar at the edge of the cell is not optimum as it increases the length of the grid lines. By placing one or more via holes and associated metal via connection areas in the interior of the active area of the solar cell, the length of the grid lines in the topside contact can be reduced with respect to that of a conventional edge busbar design. Because the via hole allows the topside contact to attach to the backplane, adjacent semiconductor devices can be connected through the backplane rather than using electrical connections across the top sides of the semiconductor devices. Thus, use of the through-epi via hole as described herein facilitates the development of these new, lower-resistance designs by removing the need to connect adjacent semiconductor devices through connections outside the backplane. Such reduced series resistance embodiments are particularly useful for high current density applications.

In some embodiments, semiconductor devices described herein may be suitable for high current density applications. In this context, "high current density" is defined as a current density of at least 100 mA/cm$^2$. In some systems that employ a concentrator, current densities can reach values of 5 or even 50 A/cm$^2$. The semiconductor devices described herein can handle current densities in a range from 5 mA/cm$^2$ to 50 A/cm$^2$ depending upon the configuration of the semiconductor device in a system and in accordance with various embodiments of the present application.

FIG. 12 illustrates a design showing nine semiconductor devices each having a via hole located in a central region of the semiconductor device away from an edge of the semiconductor device in accordance with various embodiments described herein. In FIG. 12, the topside contact for each thin film semiconductor device is formed to have concentric and radially oriented metal grid lines 1206 connected to a metal via connection area 1205 in a central region of the semiconductor device. The interior location of the metal via connection area 1205 and the corresponding via hole reduces the maximum length (and corresponding series resistance) that a topside gridline must extend to conduct current collected across the area of the thin film semiconductor device.

Figure 13:
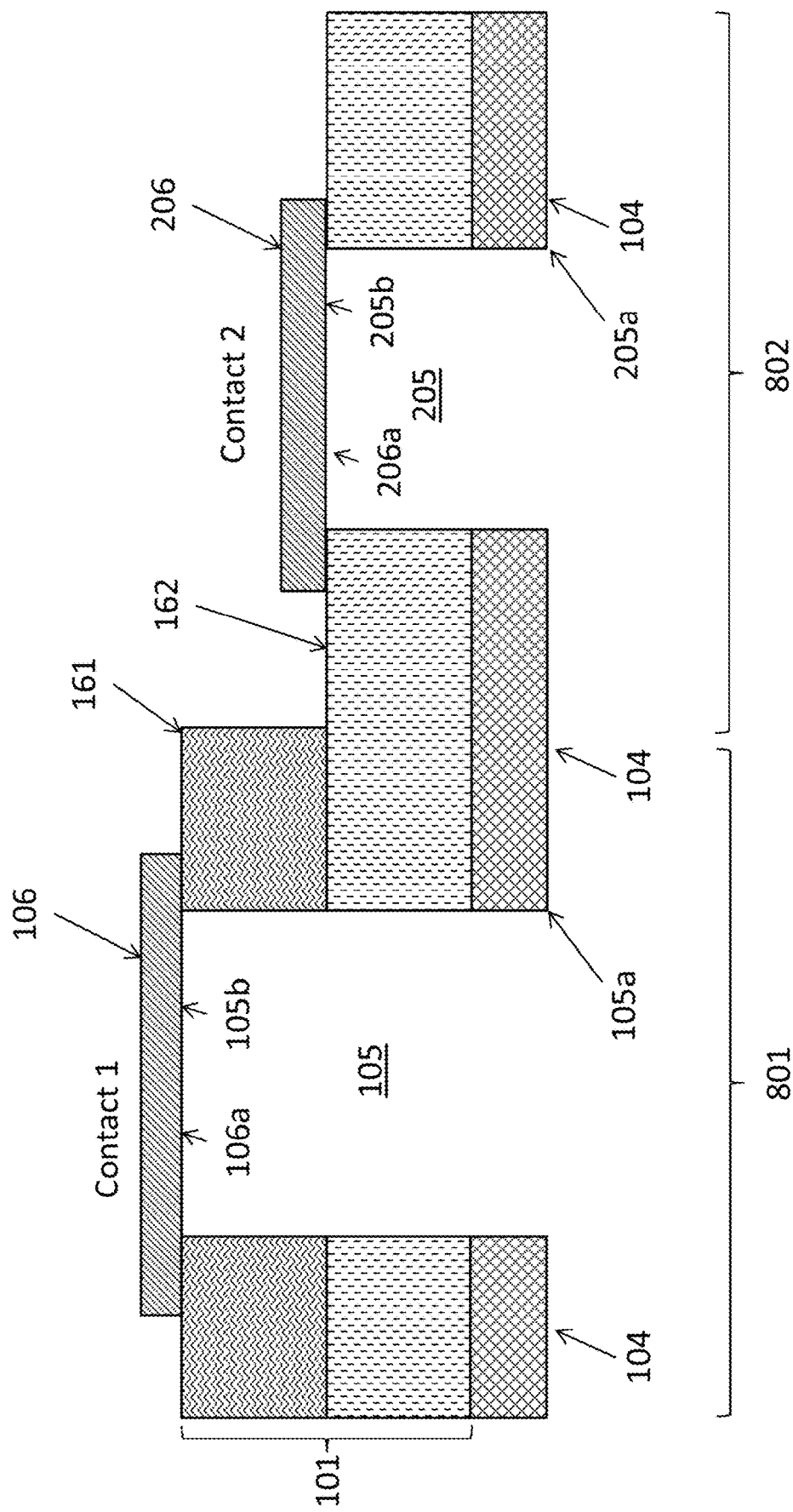
FIG. 13 schematically depicts a side cross-sectional view of a semiconductor device having laterally displaced via holes that extend to different topside contacts through different portions of the semiconductor region in accordance with some embodiments described herein.

FIG. 13 illustrates a semiconductor device having laterally displaced via holes that extend to different topside contacts through different portions of the semiconductor region in accordance with various embodiments described herein. In some embodiments, material can be removed from the topside contact, the semiconductor region, or both using any suitable method include wet etching, dry etching, and laser ablation. The top surface of the semiconductor region 101 at a first area 801 can correspond to a top surface of a first semiconductor layer 161 in the one or more semiconductor layers in the first area and topside contact in the first area 801 can be defined as a first topside contact 106. Then, a second topside contact 206 can be disposed at a second area 802 laterally offset from the first area where the top surface of the semiconductor region at the second area is a top surface of a second semiconductor layer 162 in the one or more semiconductor layers at the first area 801. A second via hole 205 formed at the second area can then extend through the bottom backside contact 104 and a portion of the semiconductor region 101 allowing access to the second topside contact 206 from a backside portion of the semiconductor device. The second via hole 205 has an open end 205a and a closed end 205b with a portion of the second topside contact 206 forming at least a portion of the closed end 205b. In some embodiments, the second topside contact 206 can form the entire closed end 205b of the second via hole 205. In some embodiments, the thin film semiconductor device having two via holes that connect to different topside contacts can form a three-terminal device such as a transistor.

In some embodiments, the first semiconductor layer 161 and the second semiconductor layer 162 can be part of the same junction in the semiconductor region 101. For example, the first semiconductor layer 161 can be the emitter region 102 while the second semiconductor layer 162 can be the base region 103. In some embodiments, the first semiconductor layer 161 and the second semiconductor layer 162 can be part of different junctions within the semiconductor region 101 having multiple junctions. For example, the first semiconductor layer 161 can be the emitter region of a first junction and the second semiconductor layer 162 can be the emitter region of a second junction. In this embodiment, the first and second junctions are vertically stacked.

Although the embodiment depicted in FIG. 13 does not show the first via hole 105 or the second via hole 205 as having a ledge or electrically insulating material 110, one of ordinary skill in the art would appreciate that either the first via hole 105, the second via hole 205, or both could have the electrically insulating layer 110 applied to create a sidewall surface and could have different widths through the semiconductor region and bottom backside contact as described above with respect to FIG. 1.

Figure 14:
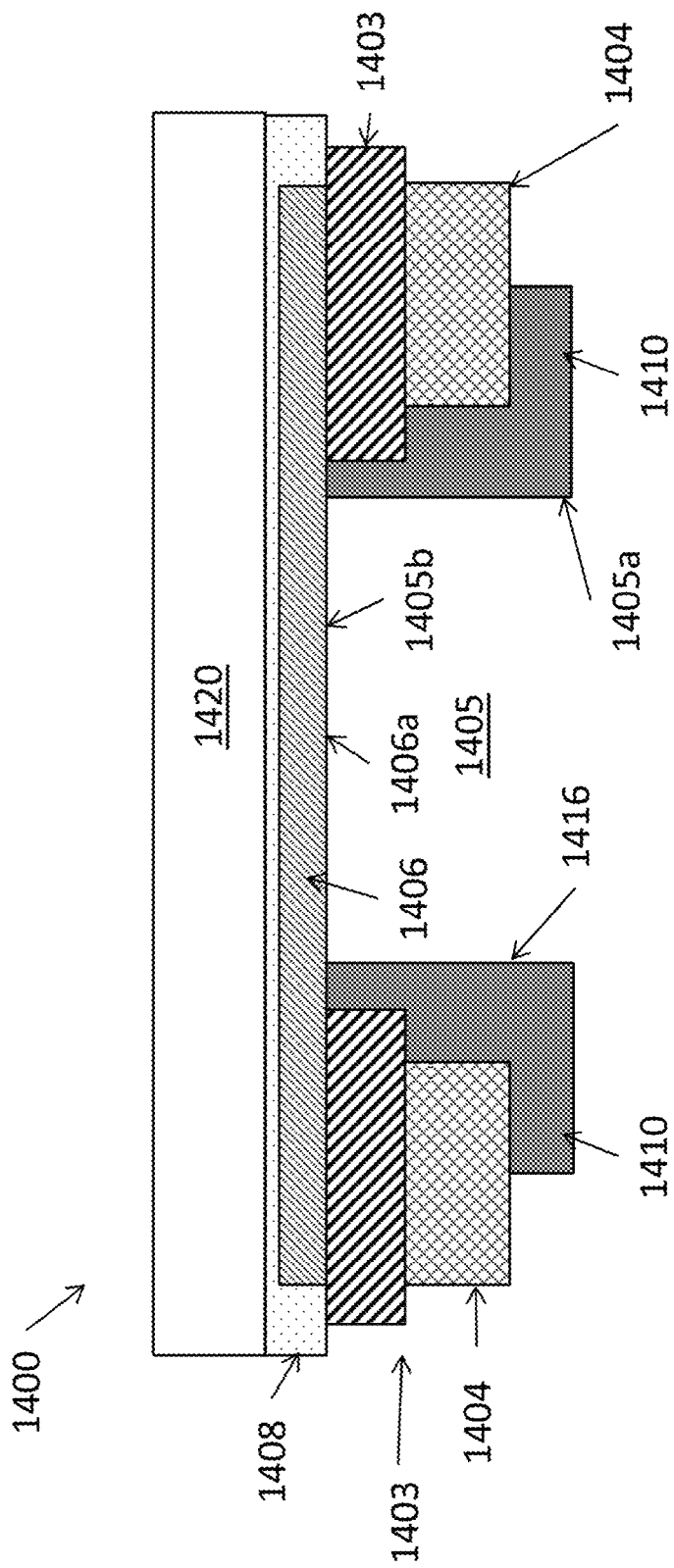
FIG. 14 schematically illustrates a side cross-sectional view of a thin film semiconductor device that is a Schottky diode in accordance with some embodiments of the present disclosure.

FIG. 14 schematically illustrates a side cross-sectional view of a thin film semiconductor device 1400 that is a Schottky diode in accordance with some embodiments of the present disclosure. The thin film semiconductor device 1400 includes a semiconductor region 101 including one or more semiconductor layers 1403 (e.g., an n-type GaAs layer, an n-type InGaPh, etc.), a bottom backside contact 1404, a topside contact 1406, and a via hole 1405 that has an open end 1405a and a closed end 1405b. The via hole 1405 extends through the bottom backside contact 1404 and the semiconductor layer 1403 such that a bottom surface 1406a of the topside contact 1406 forms at least a portion of the closed end 1405b of the via hole 1405. In some embodiments, the bottom surface 1406a of the topside contact 1406 forms the entire closed end of the via hole 1405. The via hole 1405 provides access to the bottom surface 1406a of the topside contact 1406 from a backside portion of the device 1400. In some embodiments, a sidewall 1416 is formed in the via hole 1405 by at least a portion of an electrically insulating layer 1410. In some embodiments, the device 1400 also includes a transparent support 1420 attached to the topside contact 1406.

Unlike the thin film semiconductor device 100 depicted in FIG. 1, the thin film semiconductor device 1400 can include a single semiconductor layer 1403. The semiconductor layer 1403 forms a metal-semiconductor junction at a top surface or a bottom surface of the semiconductor layer 1403 with a metal contacting layer. For example, in some embodiments, the one or more semiconductor layers 1403 form a metal-semiconductor junction with the topside contact 1406. In other embodiments, the one or more semiconductor layers 1403 form a junction with the bottom backside contact 104.

Features and options described above with embodiments show in FIGS. 1-4, 12, and 13 are also applicable to the embodiment depicted in FIG. 14.

In describing exemplary embodiments, specific terminology is used for the sake of clarity. For purposes of description, each specific term is intended to at least include all technical and functional equivalents that operate in a similar manner to accomplish a similar purpose. Additionally, in some instances where a particular exemplary embodiment includes a plurality of system elements, device components or method steps, those elements, components or steps may be replaced with a single element, component, or step. Likewise, a single element, component, or step may be replaced with a plurality of elements, components, or steps that serve the same purpose. Moreover, while exemplary embodiments have been shown and described with references to particular embodiments thereof, those of ordinary skill in the art will understand that various substitutions and alterations in form and detail may be made therein without departing from the scope of the invention. Further still, other embodiments, functions, and advantages are also within the scope of the invention.

The invention claimed is:

1. A thin film photovoltaic device free of a substrate, the thin film photovoltaic device comprising:
   a semiconductor region having an emitter region and a base region;
   a topside contact disposed directly on an illuminated top surface of the semiconductor region;
   a bottom backside contact disposed on a portion of a bottom surface of the semiconductor region base region facing away from the top surface of the semiconductor region; and
   a via hole extending through the bottom backside contact and the semiconductor region allowing access to a bottom surface of the topside contact from a backside portion of the thin film photovoltaic device, the via hole having an open end and a closed end with a portion of the bottom surface of the topside contact forming at least a portion of the closed end.

2. The thin film photovoltaic device of claim 1, further comprising a transparent support attached to the topside contact.

3. The thin film photovoltaic device of claim 1, further comprising an electrically insulating layer covering, at least, side surfaces of the bottom backside contact and the semiconductor region in the via hole forming a sidewall surface.

4. The thin film photovoltaic device of claim 3, wherein the electrically insulating layer includes a solder mask material.

5. The thin film photovoltaic device of claim 4, wherein the electrically insulating layer is configured to draw in a liquid solder material such that the liquid solder material makes electrical contact with the topside contact; and wherein the electrically insulating layer is configured to prevent the drawn in liquid solder material from directly contacting the bottom backside contact and the semiconductor region.

6. The thin film photovoltaic device of claim 4, wherein the electrically insulating layer has a first outer diameter, length, or width at the via hole as measured at the interface between the electrically insulating layer and the side surface of the bottom backside contact and a second outer diameter, length, or width at the via hole as measured at the interface of the electrically insulating layer and the side surface of the semiconductor region, wherein the first outer diameter, length, or width is larger than the second outer diameter, length, or width.

7. The thin film photovoltaic device of claim 1, wherein the topside contact comprises a metal grid connected to one or more metal via connection areas.

8. The thin film photovoltaic device of claim 7, wherein at least one of the metal via connection areas of the topside contact is disposed in a central region of the semiconductor device away from an edge of the semiconductor device.

9. The thin film photovoltaic device of claim 1, wherein the via hole has a first diameter, length, or width through the bottom backside contact and the via hole has a second diameter, length or width at the semiconductor region smaller than the first diameter, length, or width.

10. The thin film photovoltaic device of claim 1, wherein a total thickness of the semiconductor region, the topside contact, and the bottom backside contact is in a range from 5 microns to 100 microns.

11. The thin film photovoltaic device of claim 1, wherein the thin film semiconductor device is a thin film solar cell device.

12. The thin film photovoltaic device of claim 1, wherein the semiconductor region includes a plurality of semiconductor layers forming one or more junctions.

13. A solar power system, comprising:
   a first thin film photovoltaic device according to claim 1;
   a second thin film photovoltaic device according to claim 1; and
   a circuit board including electrical conductors to interconnect the topside contacts of each thin film photovoltaic device and the bottom backside contacts of each thin film photovoltaic device.

14. The solar power system of claim 13, further comprising a bypass diode connected with the first thin film photovoltaic device and the second thin film photovoltaic device.

15. The solar power system of claim 13, wherein the system is a concentrated photovoltaic (CPV) solar system and at least the first thin film semiconductor device is configured to handle high current densities associated with CPV systems.

* * * * *